United States Patent
Kuge

(10) Patent No.: US 8,598,936 B2
(45) Date of Patent: Dec. 3, 2013

(54) SEMICONDUCTOR INTEGRATED CIRCUIT

(71) Applicant: Renesas Electronics Corporation, Kawasaki (JP)

(72) Inventor: Hiroyuki Kuge, Kanagawa (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 0 days.

(21) Appl. No.: 13/765,788

(22) Filed: Feb. 13, 2013

(65) Prior Publication Data

US 2013/0222038 A1 Aug. 29, 2013

(30) Foreign Application Priority Data

Feb. 27, 2012 (JP) .................................. 2012-039624
Sep. 26, 2012 (JP) .................................. 2012-212635

(51) Int. Cl.
*H03L 5/00* (2006.01)
(52) U.S. Cl.
USPC ................................ 327/333; 326/52; 326/81
(58) Field of Classification Search
USPC .................... 326/62–63, 80–82; 327/306, 333
See application file for complete search history.

(56) References Cited

U.S. PATENT DOCUMENTS

| | | | | |
|---|---|---|---|---|
| 5,559,464 | A * | 9/1996 | Orii et al. ....................... | 327/333 |
| 7,026,855 | B2 * | 4/2006 | Sueoka et al. ................. | 327/333 |
| 7,348,800 | B2 * | 3/2008 | Koto et al. ...................... | 326/80 |
| 7,911,255 | B2 * | 3/2011 | Ochi .............................. | 327/333 |

FOREIGN PATENT DOCUMENTS

JP 3530315 B2 5/2004

* cited by examiner

*Primary Examiner* — Dinh T. Le
(74) *Attorney, Agent, or Firm* — Miles & Stockbridge P.C.

(57) ABSTRACT

A semiconductor integrated circuit includes a bypass circuit that forms a bypass path under a low voltage condition, and the bypass circuit includes first and second bypass MOS transistors respectively placed between drains of first and second PMOS transistors and a ground voltage terminal, each transistor having a gate to which a second power supply voltage is applied, and third and fourth bypass MOS transistors respectively placed between the first and second bypass MOS transistors and the ground voltage terminal, each transistor controlled to be ON and OFF in accordance with an input signal and a voltage condition.

12 Claims, 14 Drawing Sheets

SEMICONDUCTOR INTEGRATED CIRCUIT

CROSS-REFERENCE TO RELATED APPLICATIONS

This application is based upon and claims the benefit of priority from Japanese patent application No. 2012-039624, filed on Feb. 27, 2012, and Japanese patent application No. 2012-212635, filed on Sep. 26, 2012, the disclosure of which is incorporated herein in its entirety by reference.

BACKGROUND

The present invention relates to a semiconductor integrated circuit and, for example, to a semiconductor integrated circuit that can be used under several voltage conditions.

For example, an output voltage of a semiconductor integrated circuit that is mounted on an SD card is defined as either 1.8V or 3.3V by the SD card specification. Therefore, a semiconductor integrated circuit capable of generating output voltages at both voltage levels has been developed recently.

Generally, a semiconductor integrated circuit capable of generating both output voltage levels is configured using MOS transistors with a thick gate oxide film so as to withstand a high voltage condition (3.3V).

However, a semiconductor integrated circuit that is configured using MOS transistors with a thick gate oxide film has a problem of a lower operating speed and a larger circuit size. Thus, a semiconductor integrated circuit needs to be configured using MOS transistors with a gate oxide film that is as thin as possible in order to improve the operating speed and prevent an increase in circuit size.

A related art is disclosed in Japanese Patent No. 3530315. According to an output circuit (semiconductor integrated circuit) disclosed in Japanese Patent No. 3530315, even when a power supply voltage of an external LSI is higher than a withstand voltage of a gate oxide film of MOS transistors, the semiconductor output circuit outputs a signal with an amplitude of the power supply voltage of the external LSI without applying a voltage higher than the withstand voltage to the gate oxide film of each MOS transistor.

Further, according to the semiconductor output circuit, in the case where a second voltage VDD2 is equal to or lower than a first voltage VDD1 (which is under a low voltage condition), a bypass path is formed to thereby reduce the delay time when generating an output voltage of H level.

SUMMARY

However, according to the output circuit disclosed in Japanese Patent No. 3530315, because three or more MOS transistors are connected in series in a bypass path between the gate of an output transistor and the ground, the impedance of the bypass path increases. Consequently, this output circuit cannot change the gate voltage of the output transistor quickly, which causes a problem that the output voltage at a desired level cannot be generated quickly. The other problems and novel features will become obvious from the description of the specification and the appended drawings.

According to one embodiment, a semiconductor integrated circuit includes a bypass circuit that forms a bypass path under a low voltage condition, and the bypass circuit includes first and second bypass MOS transistors respectively placed between drains of first and second PMOS transistors and a ground voltage terminal, each transistor having a gate to which a second power supply voltage is applied, and third and fourth bypass MOS transistors respectively placed between the first and second bypass MOS transistors and the ground voltage terminal, each transistor controlled to be ON and OFF in accordance with an input signal and a voltage condition.

According to one embodiment, it is possible to provide a semiconductor integrated circuit capable of generating an output voltage at a desired level quickly.

BRIEF DESCRIPTION OF THE DRAWINGS

The above and other aspects, advantages and features will be more apparent from the following description of certain embodiments taken in conjunction with the accompanying drawings, in which.

DETAILED DESCRIPTION

Embodiments of the present invention are described hereinafter with reference to the drawings. It should be noted that the drawings are given in simplified form by way of illustration only, and thus are not to be considered as limiting the present invention. The same elements are denoted by the same reference symbols, and the redundant explanation is omitted.

In the following embodiments, the description will be divided into a plurality of sections or embodiments when necessary for the sake of convenience. However, unless explicitly specified otherwise, those sections or embodiments are by no means unrelated to each other, but are in such a relation that one represents a modification, a detailed or supplementary description, etc. of part or whole of the other. Further, in the following embodiments, when a reference is made to the number etc, (including the number, numeric value, quantity, range, etc.) of elements, except in such cases where it is explicitly specified otherwise or the number is obviously limited to a specific number in principle, the number is not limited to the specific number but may be greater or less than the specific number.

It is needless to mention that, in the following embodiments, their constituent elements (including constituent steps) are not necessarily essential, except in such cases where it is explicitly specified otherwise or they are obviously considered to be essential in principle. Likewise, in the following embodiments, when a reference is made to the shape, relative position, etc. of a constituent element or the like, this includes those shapes etc. substantially resembling or similar to that shape etc., except in such cases where it is explicitly specified otherwise or it is obviously considered otherwise in principle. The same applies to the number etc, (including the number, numeric value, quantity, range, etc.) mentioned above.

First Embodiment

Figure 1:
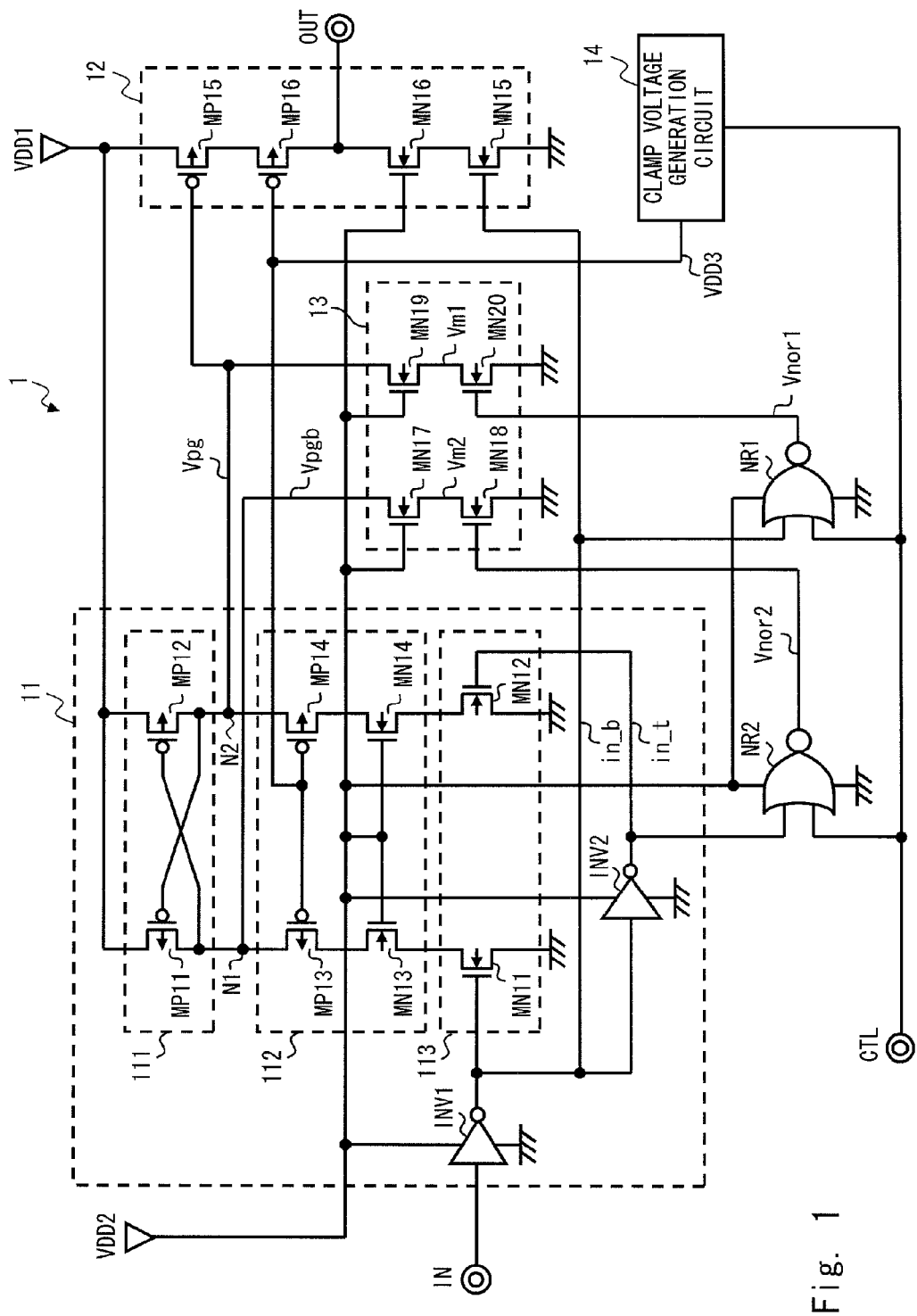
FIG. 1 is a diagram showing a configuration example of a semiconductor integrated circuit according to a first embodiment.

FIG. 1 is a diagram showing a configuration example of a semiconductor integrated circuit 1 according to a first embodiment. The semiconductor integrated circuit 1 according to this embodiment has a feature that it forms a bypass path for quickly changing the gate voltage of an output transistor under a low voltage condition, thereby quickly generating an output signal at a desired voltage level. Specific description is given below.

(Configuration of Semiconductor Integrated Circuit 1)

The configuration of the semiconductor integrated circuit 1 shown in FIG. 1 is described first. Note that the semiconductor integrated circuit 1 shown in FIG. 1 is a circuit that outputs an output signal at a voltage level in accordance with an input signal supplied from the outside and a voltage condition (high voltage condition or low voltage condition).

The semiconductor integrated circuit 1 shown in FIG. 1 includes a level shift circuit 11, an output circuit 12, a bypass circuit 13, a clamp voltage generation circuit 14, and NOR operation circuits (which is referred to hereinafter simply as "NOR circuits") NR1 and NR2.

Note that a first power supply voltage VDD1 is supplied from the power supply to a first power supply voltage terminal (which is referred to as a first power supply voltage terminal VDD1 for the sake of convenience), and a second power supply voltage VDD2 is supplied from the power supply to a second power supply voltage terminal (which is referred to as a second power supply voltage terminal VDD2 for the sake of convenience). Further, a ground voltage GND is supplied from the power supply to a ground voltage terminal (which is referred to as a ground voltage terminal GND for the sake of convenience). In this embodiment, the case where the first power supply voltage VDD1 is 3.3V under a high voltage condition and 1.8V under a low voltage condition is described as an example. Further, in this embodiment, the case where the second power supply voltage VDD2 is 1.8V is described as an example. Furthermore, in this embodiment, the case where a ground voltage GND is 0V is described as an example.

(Level Shift Circuit 11)

The level shift circuit 11 is a circuit that generates intermediate voltages Vpg and Vpgb in accordance with an input signal (which is referred to hereinafter as an input signal IN) that is supplied from the outside through an input terminal IN and a voltage condition (high voltage condition or low voltage condition).

The level shift circuit 11 includes a latch circuit 111, a clamp circuit 112, a latch inversion circuit 113, and inverter circuits INV1 and INV2.

The latch circuit 111 includes a transistor (first PMOS transistor) MP11 and a transistor (second PMOS transistor) MP12, which are P-channel MOS transistors. The clamp circuit 112 includes a transistor (third PMOS transistor) MP13 and a transistor (fourth PMOS transistor) MP14, which are P-channel MOS transistors, and a transistor (first NMOS transistor) MN13 and a transistor (second NMOS transistor) MN14, which are N-channel MOS transistors. The latch inversion circuit 113 includes a transistor (third NMOS transistor) MN11 and a transistor (fourth NMOS transistor) MN12, which are N-channel MOS transistors. Note that, as the transistors MP11 to MP14 and MN11 to MN14, transistors with a relatively thin gate oxide film (with a relatively low withstand voltage) are used. Specifically, a transistor that can withstand a voltage under a low voltage condition is used for each of the transistors MP11 to MP14 and MN11 to MN14.

In the latch circuit 111, the source of the transistor MP11 is connected to the first power supply voltage terminal VDD1, the drain of the transistor MP11 is connected to a node N1, and the gate of the transistor MP11 is connected to a node N2. The source of the transistor MP12 is connected to the first power supply voltage terminal VDD1, the drain of the transistor MP12 is connected to the node N2, and the gate of the transistor MP12 is connected to the node N1.

In the clamp circuit 112, the source of the transistor MP13 is connected to the node N1, the drain of the transistor MP13 is connected to the drain of the transistor MN13, a clamp voltage VDD3 (which is described later) is applied to the gate of the transistor MP13. The source of the transistor MP14 is connected to the node N2, the drain of the transistor MP14 is connected to the drain of the transistor MN14, and the clamp voltage VDD3 (which is described later) is applied to the gate of the transistor MP14. The source of the transistor MN13 is connected to the drain of the transistor MN11, and the second power supply voltage VDD2 is applied to the gate of the transistor MN13. The source of the transistor MN14 is connected to the drain of the transistor MN12, and the second power supply voltage VDD2 is applied to the gate of the transistor MN14.

In the latch inversion circuit 113, the source of the transistor MN11 is connected to the ground voltage terminal GND, and the output of the inverter circuit INV1 (which is the inverted signal of the input signal IN) is applied to the gate of the transistor MN11. The source of the transistor MN12 is connected to the ground voltage terminal GND, and the output of the inverter circuit INV2 (which is the non-inverted signal of the input signal IN) is applied to the gate of the transistor MN12. Accordingly, ON and OFF of the transistors MN11 and MN12 are controlled in a complementary manner according to the input signal IN.

In the level shift circuit 11, the voltages of the nodes N2 and N1 are output as the intermediate voltages Vpg and Vpgb, respectively. A specific operation of the level shift circuit 11 is described later in the description of an operation of the semiconductor integrated circuit 1.

(Clamp Voltage Generation Circuit 14)

The clamp voltage generation circuit 14 is a circuit that generates a clamp voltage VDD3 in accordance with a voltage condition. Specifically, the clamp voltage generation circuit 14 generates the clamp voltage VDD3 in accordance with a voltage condition switch signal (which is referred to hereinafter as a voltage condition switch signal CTL) that is supplied from the outside through an input terminal CTL. Note that, in this embodiment, the case where the voltage condition switch signal CTL is L level under a low voltage condition (VDD1=1.8V) and the voltage condition switch signal CTL is H level under a high voltage condition (VDD1=3.3V) is described as an example.

For example, under the low voltage condition, the clamp voltage generation circuit 14 generates the clamp voltage VDD3 at the ground voltage level (0V) in accordance with the voltage condition switch signal CTL at L level. On the other hand, under the high voltage condition, the clamp voltage generation circuit 14 generates the clamp voltage VDD3 at the second power supply voltage level (1.8V) in accordance with the voltage condition switch signal CTL at H level.

The clamp voltage VDD3 is applied to each gate of the transistors MP13 and MP14 of the level shift circuit 11 and also applied to the gate of a transistor MP16 of the output circuit 12, which is described later.

(Specific Configuration Example of Clamp Voltage Generation Circuit 14)

Figure 2:
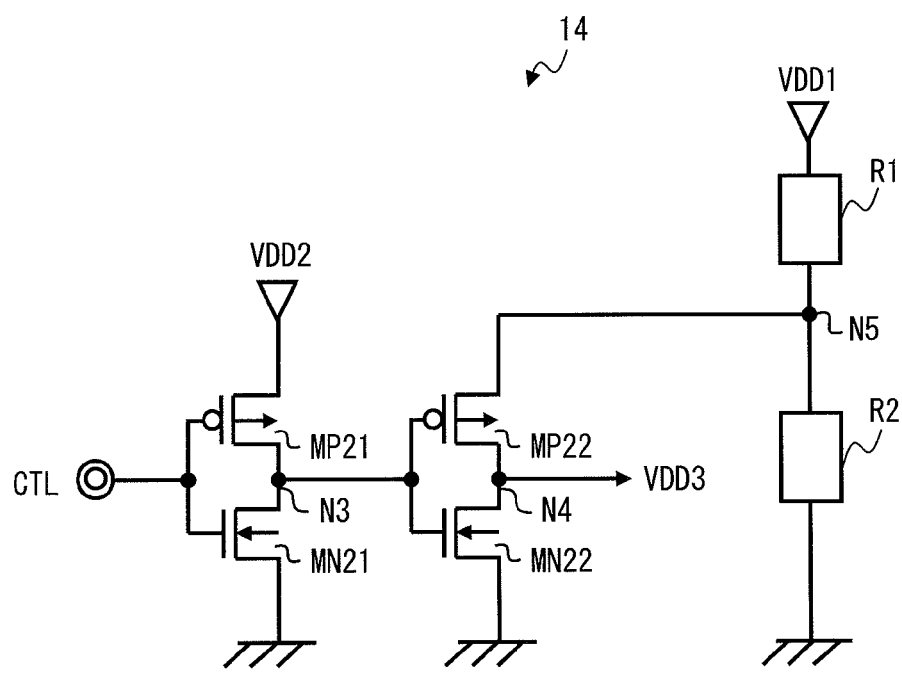
FIG. 2 is a diagram showing a configuration example of a clamp voltage generation circuit included in the semiconductor integrated circuit according to the first embodiment.

FIG. 2 is a diagram showing a specific configuration example of the clamp voltage generation circuit 14. The clamp voltage generation circuit 14 shown in FIG. 2 includes transistors MP21 and MP22, which are P-channel MOS transistors, transistors MN21 and MN22, which are N-channel MOS transistors, and resistors R1 and R2.

The resistors R1 and R2 are connected in series between the first power supply voltage terminal VDD1 and the ground voltage terminal GND. Specifically, one end of the resistor R1 is connected to the first power supply voltage terminal VDD1, and the other end of the resistor R1 is connected to a node N5. One end of the resistor R2 is connected to the node N5, and the other end of the resistor R2 is connected to the ground voltage terminal GND. In this embodiment, the case where the voltage of the node N5 is the second power supply voltage level (1.8V) is described as an example, though not limited thereto. By adjusting the resistance ratio of the resistors R1 and R2, the voltage of the node N5 can be changed as appropriate to a voltage that is higher than the ground voltage GND and lower than the first power supply voltage VDD1.

A first inverter circuit is composed of the transistors MP21 and MN21. Specifically, the source of the transistor MP21 is connected to the second power supply voltage terminal VDD2, the drain of the transistor MP21 is connected to a node N3, and the voltage condition switch signal CTL is applied to the gate of the transistor MP21. The source of the transistor MN21 is connected to the ground voltage terminal GND, the drain of the transistor MN21 is connected to the node N3, and the voltage condition switch signal CTL is applied to the gate of the transistor MN21. The first inverter circuit outputs the voltage of the node N3 as the inverted signal of the voltage condition switch signal CTL.

A second inverter circuit is composed of the transistors MP22 and MN22. Specifically, the source of the transistor MP22 is connected to the node N5, the drain of the transistor MP22 is connected to a node N4, and the output of the first inverter circuit (the voltage of the node N3) is applied to the gate of the transistor MP22. The source of the transistor MN22 is connected to the ground voltage terminal GND, the drain of the transistor MN22 is connected to the node N4, and the output of the first inverter circuit (the voltage of the node N3) is applied to the gate of the transistor MN22. The second inverter circuit outputs the voltage of the node N4 as the clamp voltage VDD3.

For example, under the low voltage condition, which is when the voltage condition switch signal CTL is L level, the clamp voltage generation circuit 14 outputs the clamp voltage VDD3 at the ground voltage level (0V). On the other hand, under the high voltage condition, which is when the voltage condition switch signal CTL is H level, the clamp voltage generation circuit 14 outputs the voltage of the node N5 (which is the second power supply voltage level (1.8V)) as the clamp voltage VDD3.

The configuration of the clamp voltage generation circuit 14 shown in FIG. 2 is just one example, and it may be altered as appropriate to a circuit configuration having the same function.

(Output Circuit 12)

The output circuit 12 is a circuit that outputs an output signal (hereinafter, a signal output from an output terminal OUT is referred to as an output signal OUT) in accordance with the input signal IN and the intermediate voltage Vpg.

The output circuit 12 includes a transistor (fifth PMOS transistor) MP15 and a transistor (sixth PMOS transistor) MP16, which are P-channel MOS transistors, and a transistor (fifth NMOS transistor) MN15 and a transistor (sixth NMOS transistor) MN16, which are N-channel MOS transistors. Note that, as the transistors MP15, MP16, MN15 and MN16, transistors with a relatively thin gate oxide film (with a relatively low withstand voltage) are used. Specifically, a transistor that can withstand a voltage under a low voltage condition is used for each of the transistors MP15, MP16, MN15 and MN16.

In the output circuit 12, the source of the transistor MP15 is connected to the first power supply voltage terminal VDD1, the drain of the transistor MP15 is connected to the source of the transistor MP16, and the intermediate voltage Vpg is applied to the gate of the transistor MP15. The drain of the transistor MP16 is connected to the output terminal OUT, and the clamp voltage VDD3 is applied to the gate of the transistor MP16. The source of the transistor MN15 is connected to the ground voltage terminal GND, the drain of the transistor MN15 is connected to the source of the transistor MN16, and the output of the inverter circuit INV1 (which is the inverted signal of the input signal IN) is applied to the gate of the transistor MN15. The drain of the transistor MN16 is connected to the output terminal OUT, and the second power supply voltage VDD2 is applied to the gate of the transistor MN16.

The output circuit 12 outputs the output signal OUT at the first power supply voltage level (3.3V or 1.8V) when the transistors MP15 and MP16 are ON and the transistors MN15 and MN16 are OFF. On the other hand, the output circuit 12 outputs the output signal OUT at the ground voltage level (0V) when the transistors MP15 and MP16 are OFF and the transistors MN15 and MN16 are ON.

(Bypass Circuit 13)

The bypass circuit 13 is a circuit that forms a bypass path (current path) between the node N1 or N2 and the ground voltage terminal GND under the low voltage condition.

The bypass circuit 13 includes a transistor (first bypass MOS transistor) MN17, a transistor (third bypass MOS transistor) MN18, a transistor (second bypass MOS transistor) MN19 and a transistor (fourth bypass MOS transistor) MN20, which are N-channel MOS transistors. Note that, as the transistors MN17 to MN20, transistors with a relatively thin gate oxide film (with a relatively low withstand voltage) are used.

Specifically, a transistor that can withstand a voltage under a low voltage condition is used for each of the transistors MN17 to MN20.

In the bypass circuit 13, the source of the transistor MN17 is connected to a node Vm2, the drain of the transistor MN17 is connected to the node N1, and the second power supply voltage VDD2 is applied to the gate of the transistor MN17. The source of the transistor MN18 is connected to the ground voltage terminal GND, the drain of the transistor MN18 is connected to the node Vm2, and an output signal Vnor2 of the NOR circuit NR2 is applied to the gate of the transistor MN18. The source of the transistor MN19 is connected to a node Vm1, the drain of the transistor MN19 is connected to the node N2, and the second power supply voltage VDD2 is applied to the gate of the transistor MN19. The source of the transistor MN20 is connected to the ground voltage terminal GND, the drain of the transistor MN20 is connected to the node Vm1, and an output signal Vnor1 of the NOR circuit NR1 is applied to the gate of the transistor MN20.

Note that the NOR circuit NR1 outputs NOR of the voltage condition switch signal CTL and the output of the inverter circuit INV1 (which is the inverted signal of the input signal IN) as an output signal Vnor1. Further, the NOR circuit NR2 outputs NOR of the voltage condition switch signal CTL and the output of the inverter circuit INV2 (which is the non-inverted signal of the input signal IN) as an output signal Vnor2.

For example, under the high voltage condition, which is when the voltage condition switch signal CTL is H level, the NOR circuit NR1 outputs the output signal Vnor1 at L level regardless of the input signal IN. Likewise, the NOR circuit NR2 outputs the output signal Vnor2 at L level regardless of the input signal IN. Thus, under the high voltage condition, the transistors MN18 and MN20 are both OFF.

On the other hand, under the low voltage condition, which is when the voltage condition switch signal CTL is L level, the NOR circuit NR1 outputs the inverted signal of the inverter circuit INV1 (which is the non-inverted signal of the input signal IN) as the output signal Vnor1. Further, the NOR circuit NR2 outputs the inverted signal of the inverter circuit INV2 (which is the inverted signal of the input signal IN) as the output signal Vnor2. Thus, under the low voltage condition, the transistor MN18 is ON when the transistor MN11 is ON, the transistor MN20 is ON when the transistor MN12 is ON, the transistor MN18 is OFF when the transistor MN11 is OFF, and the transistor MN20 is OFF when the transistor MN12 is OFF.

(Operation of Semiconductor Integrated Circuit 1)

Figure 3:
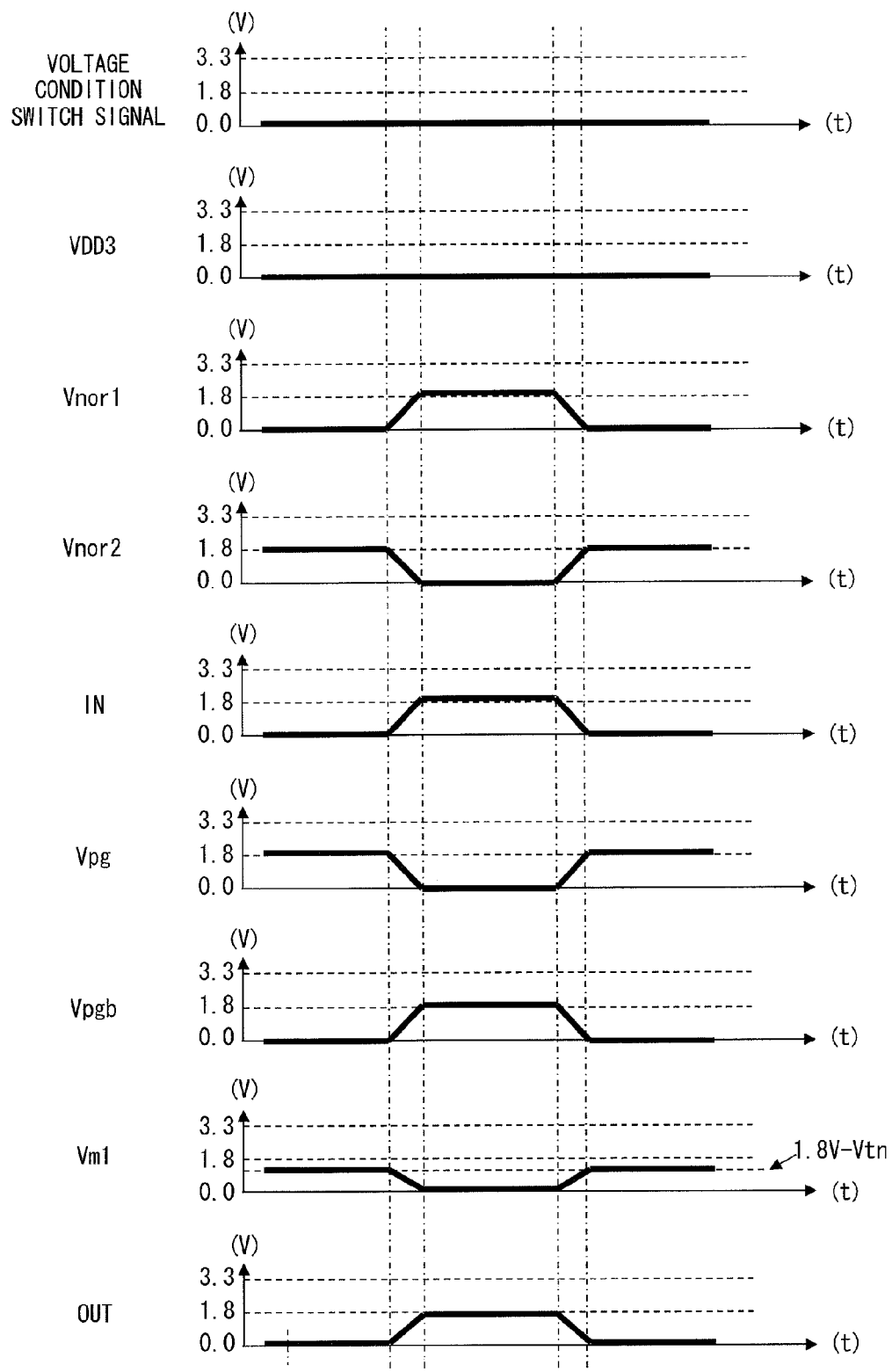
FIG. 3 is a timing chart showing an operation of the semiconductor integrated circuit according to the first embodiment under a low voltage condition.
Figure 4:
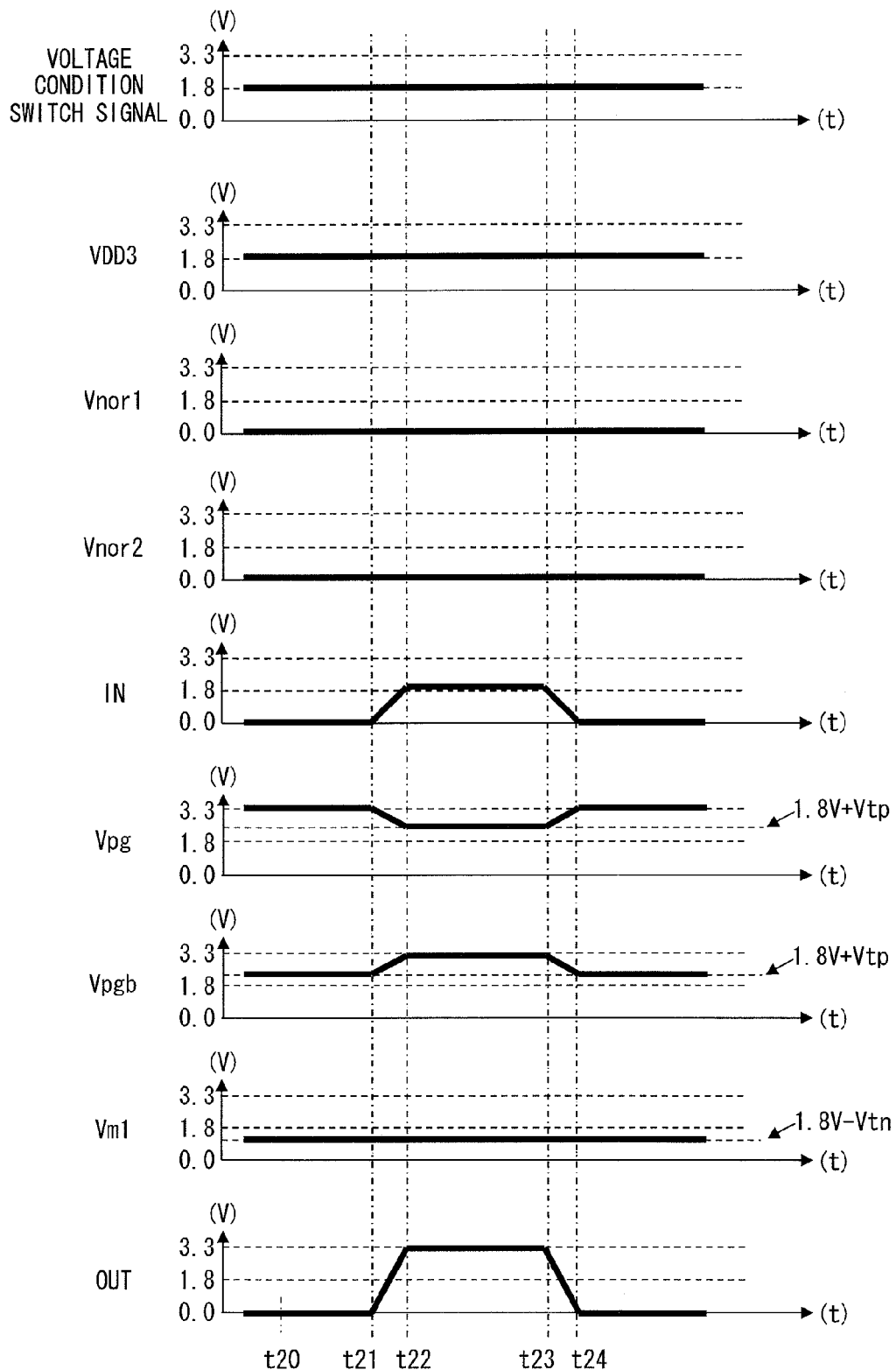
FIG. 4 is a timing chart showing an operation of the semiconductor integrated circuit according to the first embodiment under a high voltage condition.

The operation of the semiconductor integrated circuit 1 is described hereinafter with reference to FIGS. 3 and 4. FIG. 3 is a timing chart showing the operation of the semiconductor integrated circuit 1 under the low voltage condition. FIG. 4 is a timing chart showing the operation of the semiconductor integrated circuit 1 under the high voltage condition. Note that, in this embodiment, the case where a threshold voltage (which is referred to hereinafter as a threshold voltage Vtp) of the transistors MP11 to MP16 is the same is described as an example to simplify the description. Likewise, in this embodiment, the case where a threshold voltage (which is referred to hereinafter as a threshold voltage Vtn) of the transistors MN11 to MN20 is the same is described as an example.

(Operation of Semiconductor Integrated Circuit 1 Under Low Voltage Condition)

First, the operation of the semiconductor integrated circuit 1 under the low voltage condition is described with reference to FIG. 3. Note that, under the low voltage condition, the first power supply voltage VDD1 is 1.8V, the second power supply voltage VDD2 is 1.8V, and the ground voltage GND is 0V.

Further, under the low voltage condition, the voltage condition switch signal CTL is L level. Accordingly, the clamp voltage generation circuit 14 generates the clamp voltage VDD3 at the ground voltage level (0V). The NOR circuit NR1 outputs the inverted signal of the inverter circuit INV1 (which is the non-inverted signal of the input signal IN) as the output signal Vnor1. The NOR circuit NR2 outputs the inverted signal of the inverter circuit INV2 (which is the inverted signal of the input signal IN) as the output signal Vnor2.

First, in the initial state (time t10), the input signal IN is L level (ground voltage level). Thus, the output of the inverter circuit INV1 is H level (second power supply voltage level), and the output of the inverter circuit INV2 is L level (ground voltage level). Accordingly, the output signal Vnor1 of the NOR circuit NR1 is L level (ground voltage level), and the output signal Vnor2 of the NOR circuit NR2 is H level (second power supply voltage level). Further, the voltage of the node N2 (intermediate voltage Vpg) is the first power supply voltage level (1.8V), and the voltage of the node N1 (intermediate voltage Vpgb) is the ground voltage level (0V). The output circuit 12 outputs the output signal OUT at L level (ground voltage level).

Note that, at this time, the transistors MP12, MP13, MN11, MN13, MN15, MN16, MN17 and MN18 are all ON, and the transistors MP11, MP14, MP15, MP16, MN12, MN14, MN19 and MN20 are all OFF.

When the input signal IN starts changing from L level (ground voltage level) to H level (second power supply voltage level) (time t11), the output of the inverter circuit INV1 starts changing from H level (second power supply voltage level) to L level (ground voltage level), and the output of the inverter circuit INV2 starts changing from L level (ground voltage level) to H level (second power supply voltage level) accordingly. Consequently, the output Vnor1 of the NOR circuit NR1 starts changing from L level (ground voltage level) to H level (second power supply voltage level), and the output Vnor2 of the NOR circuit NR2 starts changing from H level (second power supply voltage level) to L level (ground voltage level). Hereinafter, the period from when the input signal IN starts rising (time t11) to when the output signal OUT rises (time 12) is described in detail.

When the output voltage of the inverter circuit INV2 becomes equal to or higher than the threshold voltage Vtn of the transistor MN12, the transistor MN12 turns ON. Further, the transistor MN14 is ON because its gate is clamped to the second power supply voltage VDD2. The transistor MP14 is ON because its gate is clamped to the clamp voltage VDD3 at the ground voltage level (0V). Accordingly, a current starts flowing from the node N2 to the ground voltage terminal GND through the transistors MP14, MN14 and MN12. Consequently, the voltage of the node N2 (intermediate voltage Vpg) starts dropping from the first power supply voltage level (1.8V). Note that the transistor MP12 remains ON.

On the other hand, because the output voltage of the inverter circuit INV1 becomes lower than the threshold voltage Vtn of the transistor MN11, the transistor MN11 turns OFF. Accordingly, a current stops flowing from the node N1 to the ground voltage terminal GND through the transistors MP13, MN13 and MN11. Note that the transistor MP11 remains OFF.

Further, when the output Vnor1 of the NOR circuit NR1 becomes equal to or higher than the threshold voltage Vtn of the transistor MN20, the transistor MN20 turns ON. Further, the transistor MN19 is ON because the second power supply voltage VDD2 is applied to its gate. Thus, a bypass path (current path) is formed between the node N2 and the ground voltage terminal GND, besides the above-described current path through the transistors MP14, MN14 and MN12. Only two transistors MN19 and MN20 are placed in series on the bypass path. Therefore, the impedance of the bypass path is relatively small. Accordingly, a relatively large current starts flowing from the node N2 to the ground voltage terminal GND through the transistors MN19 and MN20. The voltage of the node N2 (intermediate voltage Vpg) thereby drops rapidly.

On the other hand, because the output Vnor2 of the NOR circuit NR2 becomes lower than the threshold voltage Vtn of the transistor MN18, the transistor MN18 turns OFF. Accordingly, a current stops flowing from the node N1 to the ground voltage terminal GND through the transistors MN17 and MN18.

When the voltage of the node N2 (intermediate voltage Vpg) drops to a voltage that is lower than the first power supply voltage VDD1 (1.8V) by the threshold voltage Vtp of the transistor MP11 (Vpg=VDD1−Vtp), the transistor MP11 where the voltage of the node N2 is applied to the gate changes from OFF to ON. The voltage of the node N1 (intermediate voltage Vpgb) thereby rises to the first power supply voltage level. Consequently, the transistor MP12 where the voltage of the node N1 is applied to the gate changes from ON to OFF. The voltage of the node N2 (intermediate voltage Vpg) thereby drops further to the ground voltage level (0V).

When the voltage of the node N2 (intermediate voltage Vpg) reaches the ground voltage level, the transistor MP15 turns ON. The transistor MP16 is ON because its gate is clamped to the clamp voltage VDD3 at the ground voltage level. Accordingly, a current flows from the first power supply voltage terminal VDD1 to the output terminal OUT through the transistors MP15 and MP16. On the other hand, the transistor MN15 is OFF because a signal at L level (output of the inverter circuit INV1) is applied to its gate. Accordingly, a current does not flow from the output terminal OUT to the ground voltage terminal GND through the transistors MN16 and MN15. Therefore, the voltage of the output terminal OUT rises to the first power supply voltage level (1.8V). Thus, the output circuit 12 outputs the output signal OUT at H level (1.8V) under the low voltage condition (time t12).

As described above, under the low voltage condition, when the input signal IN rises, a bypass path (current path) with a relatively low impedance is formed between the node N2 and the ground voltage terminal GND. The voltage of the node N2 (intermediate voltage Vpg) thereby drops to the ground voltage level relatively rapidly. Accordingly, the output signal OUT rises to the first power supply voltage level quickly.

Then, when the input signal IN starts changing from H level (second power supply voltage level) to L level (ground voltage level) (time t13), the output of the inverter circuit INV1 starts changing from L level (ground voltage level) to H level (second power supply voltage level), and the output of the inverter circuit INV2 starts changing from H level (second power supply voltage level) to L level (ground voltage level) accordingly. Consequently, the output Vnor1 of the NOR circuit NR1 starts changing from H level (second power supply voltage level) to L level (ground voltage level), and the output Vnor2 of the NOR circuit NR2 starts changing from L level (ground voltage level) to H level (second power supply voltage level). Hereinafter, the period from when the input signal IN starts falling (time t13) to when the output signal OUT falls (time 14) is described in detail.

When the output voltage of the inverter circuit INV1 becomes equal to or higher than the threshold voltage Vtn of the transistor MN11, the transistor MN11 turns ON. Further, the transistor MN13 is ON because its gate is clamped to the second power supply voltage VDD2. The transistor MP13 is ON because its gate is clamped to the clamp voltage VDD3 at the ground voltage level (0V). Accordingly, a current starts flowing from the node N1 to the ground voltage terminal GND through the transistors MP13, MN13 and MN11. Consequently, the voltage of the node N1 (intermediate voltage Vpgb) starts dropping from the first power supply voltage level (1.8V). Note that the transistor MP11 remains ON.

On the other hand, because the output voltage of the inverter circuit INV2 becomes lower than the threshold voltage Vtn of the transistor MN12, the transistor MN12 turns OFF. Accordingly, a current stops flowing from the node N2 to the ground voltage terminal GND through the transistors MP14, MN14 and MN12. Note that the transistor MP12 remains OFF.

Further, when the output Vnor2 of the NOR circuit NR2 becomes equal to or higher than the threshold voltage Vtn of the transistor MN18, the transistor MN18 turns ON. Further, the transistor MN17 is ON because the second power supply voltage VDD2 is applied to its gate. Thus, a bypass path (current path) is formed between the node N1 and the ground voltage terminal GND, besides the above-described current path through the transistors MP13, MN13 and MN11. Only two transistors MN17 and MN18 are placed in series on the bypass path. Therefore, the impedance of the bypass path is relatively small. Accordingly, a relatively large current starts flowing from the node N1 to the ground voltage terminal GND through the transistors MN17 and MN18. The voltage of the node N1 (intermediate voltage Vpgb) thereby drops rapidly.

On the other hand, because the output Vnor1 of the NOR circuit NR1 becomes lower than the threshold voltage Vtn of the transistor MN20, the transistor MN20 turns OFF. Accordingly, a current stops flowing from the node N2 to the ground voltage terminal GND through the transistors MN19 and MN20.

When the voltage of the node N1 (intermediate voltage Vpgb) drops to a voltage that is lower than the first power supply voltage VDD1 (1.8V) by the threshold voltage Vtp of the transistor MP12 (Vpgb=VDD1−Vtp), the transistor MP12 where the voltage of the node N1 is applied to the gate changes from OFF to ON. The voltage of the node N2 (intermediate voltage Vpg) thereby rises to the first power supply voltage level. Consequently, the transistor MP11 where the voltage of the node N2 is applied to the gate changes from OFF to ON. The voltage of the node N1 (intermediate voltage Vpgb) thereby drops further to the ground voltage level (0V).

When the voltage of the node N2 (intermediate voltage Vpg) reaches the first power supply voltage level, the transistor MP15 turns OFF. Accordingly, a current does not flow from the first power supply voltage terminal VDD1 to the output terminal OUT through the transistors MP15 and MP16. On the other hand, the transistor MN15 turns ON because a signal at H level (output of the inverter circuit INV1) is applied to its gate. Further, the transistor MN16 is ON because its gate is clamped to the second power supply voltage VDD2. Accordingly, a current flows from the output terminal OUT to the ground voltage terminal GND through the transistors MN16 and MN15. Therefore, the voltage of the output terminal OUT drops to the ground voltage level (0V). Thus, the output circuit 12 outputs the output signal OUT at L level (0V) (time t14).

As described above, under the low voltage condition, when the input signal IN rises, a bypass path (current path) with a relatively low impedance is formed between the node N1 and the ground voltage terminal GND. The voltage of the node N1

(intermediate voltage Vpgb) thereby drops to the ground voltage level relatively rapidly. Thus, the voltage of the node N2 (intermediate voltage Vpg) rises to the first power supply voltage level relatively rapidly. Accordingly, the output signal OUT drops to the ground voltage level quickly.

In sum, in the semiconductor integrated circuit 1 according to this embodiment, a bypass path (current path) with a relatively low impedance is formed between the node N1 or the node N2 and the ground voltage terminal GND under the low voltage condition. Therefore, in the semiconductor integrated circuit 1 according to this embodiment, the voltage of the node N1, N2 (the intermediate voltage Vpgb, Vpg) can change to a desired voltage relatively quickly under the low voltage condition. The semiconductor integrated circuit 1 according to this embodiment can thereby output the output signal OUT at a desired voltage level quickly under the low voltage condition.

Note that, because a high voltage (3.3V) is not supplied under the low voltage condition, a voltage higher than a withstand voltage is not applied to each transistor with a relatively low withstand voltage. Therefore, the breakdown and degradation of transistors do not occur.

(Operation of Semiconductor Integrated Circuit 1 Under High Voltage Condition)

Next, the operation of the semiconductor integrated circuit 1 under the high voltage condition is described with reference to FIG. 4. Note that, under the high voltage condition, the first power supply voltage VDD1 is 3.3V, the second power supply voltage VDD2 is 1.8V, and the ground voltage GND is 0V.

Further, under the high voltage condition, the voltage condition switch signal CTL is H level. Accordingly, the clamp voltage generation circuit 14 generates the clamp voltage VDD3 at the second power supply voltage level (1.8V). The NOR circuit NR1 outputs the output signal Vnor1 at L level (ground voltage level) regardless of the input signal IN. The NOR circuit NR2 outputs the output signal Vnor2 at L level (ground voltage level) regardless of the input signal IN. Thus, a bypass path is not formed between the node N1, N2 and the ground voltage terminal GND under the high voltage condition.

First, in the initial state (time t20), the input signal IN is L level (ground voltage level). Thus, the output of the inverter circuit INV1 is H level (second power supply voltage level), and the output of the inverter circuit INV2 is L level (ground voltage level). Further, the voltage of the node N2 (intermediate voltage Vpg) is the first power supply voltage level (3.3V), and the voltage of the node N1 (intermediate voltage Vpgb) is a value that is higher than the clamp voltage VDD3 (1.8V) by the threshold voltage Vtp of the transistor MP13. The output circuit 12 outputs the output signal OUT at L level (ground voltage level).

Note that, at this time, the transistors MP12, MP13, MN11, MN13, MN15 and MN16 are all ON, and the transistors MP11, MP14, MP15, MP16, MN12, MN14, MN17, MN18, MN19 and MN20 are all OFF.

When the input signal IN starts changing from L level (ground voltage level) to H level (second power supply voltage level) (time t21), the output of the inverter circuit INV1 starts changing from H level (second power supply voltage level) to L level (ground voltage level), and the output of the inverter circuit INV2 starts changing from L level (ground voltage level) to H level (second power supply voltage level) accordingly. Hereinafter, the period from when the input signal IN starts rising (time t21) to when the output signal OUT rises (time 22) is described in detail.

When the output voltage of the inverter circuit INV2 becomes equal to or higher than the threshold voltage Vtn of the transistor MN12, the transistor MN12 turns ON. Further, the transistor MN14 is ON because its gate is clamped to the second power supply voltage VDD2. The transistor MP14 is ON because its gate is clamped to the clamp voltage VDD3 at 1.8V. Accordingly, a current starts flowing from the node N2 to the ground voltage terminal GND through the transistors MP14, MN14 and MN12. Consequently, the voltage of the node N2 (intermediate voltage Vpg) starts dropping from the first power supply voltage level (3.3V). Note that the transistor MP12 remains ON.

On the other hand, because the output voltage of the inverter circuit INV1 becomes lower than the threshold voltage Vtn of the transistor MN11, the transistor MN11 turns OFF. Accordingly, a current stops flowing from the node N1 to the ground voltage terminal GND through the transistors MP13, MN13 and MN11. Note that the transistor MP11 remains OFF.

Note that, as described above, the transistors MN18 and MN20 are both OFF. Thus, a bypass path is not formed between the node N1, N2 and the ground voltage terminal GND.

When the voltage of the node N2 (intermediate voltage Vpg) drops to a voltage that is lower than the first power supply voltage VDD1 (3.3V) by the threshold voltage Vtp of the transistor MP11 (Vpg=VDD1−Vtp), the transistor MP11 where the voltage of the node N2 is applied to the gate changes from OFF to ON. The voltage of the node N1 (intermediate voltage Vpgb) thereby rises to the first power supply voltage level (3.3V). Consequently, the transistor MP12 where the voltage of the node N1 is applied to the gate changes from ON to OFF. The voltage of the node N2 (intermediate voltage Vpg) thereby drops further to a voltage that is higher than the clamp voltage VDD3 (1.8V) by the threshold voltage Vtp of the transistor MP14.

When the voltage of the node N2 (intermediate voltage Vpg) drops to a voltage that is higher than the clamp voltage VDD3 by the threshold voltage Vtp of the transistor MP14, the transistor MP15 turns ON because a gate-source voltage Vgs becomes higher than the threshold voltage Vtp. The transistor MP16 also turns ON because a gate-source voltage Vgs becomes higher than the threshold voltage Vtp. Accordingly, a current flows from the first power supply voltage terminal VDD1 to the output terminal OUT through the transistors MP15 and MP16. On the other hand, the transistor MN15 is OFF because a signal at L level (output of the inverter circuit INV1) is applied to its gate. Accordingly, a current does not flow from the output terminal OUT to the ground voltage terminal GND through the transistors MN16 and MN15. Therefore, the voltage of the output terminal OUT rises to the first power supply voltage level (3.3V). Thus, the output circuit 12 outputs the output signal OUT at H level (3.3V) under the high voltage condition (time t22).

Note that, because the transistors MN18 and MN20 are OFF, the voltages of the nodes Vm2 and Vm1 do not drop to the ground voltage level. Further, because the gates of the transistors MN17 and MN19 are clamped to the second power supply voltage VDD2, the voltages of the nodes Vm2 and Vm1 do not rise to be higher than a voltage that is lower than the second power supply voltage VDD2 by the threshold voltage Vtn of the transistors MN17 and MN19. Thus, 0V<voltage of node Vm2,Vm1≤(second power supply voltage VDD2−threshold voltage Vtn) is satisfied.

Consequently, a voltage higher than a withstand voltage (for example, (3.3V)) is not applied between the source and the drain, the gate and the source, and the gate and the drain of each of the transistors MN17 to MN20 that constitute the bypass circuit 13. Therefore, the breakdown and degradation of each of the transistors MN17 to MN20 with a relatively low withstand voltage do not occur.

Note that a voltage higher than a withstand voltage (for example, (3.3V)) is not applied also between the source and the drain, the gate and the source, and the gate and the drain of each of the transistors MP11 to MP14 and MN11 to MN14 that constitute the level shift circuit 11. Likewise, a voltage higher than a withstand voltage (for example, (3.3V)) is not applied also between the source and the drain, the gate and the source, and the gate and the drain of each of the transistors MP15, MP16, MN15 and MN16 that constitute the output circuit 12. Therefore, the breakdown and degradation of each of the transistors MP11 to MP16 and MN11 to MN16 with a relatively low withstand voltage do not occur.

Then, when the input signal IN starts changing from H level (second power supply voltage level) to L level (ground voltage level) (time t23), the output of the inverter circuit INV1 starts changing from L level (ground voltage level) to H level (second power supply voltage level), and the output of the inverter circuit INV2 starts changing from H level (second power supply voltage level) to L level (ground voltage level) accordingly. Hereinafter, the period from when the input signal IN starts falling (time t23) to when the output signal OUT falls (time 24) is described in detail.

When the output voltage of the inverter circuit INV1 becomes equal to or higher than the threshold voltage Vtn of the transistor MN13, the transistor MN11 turns ON. Further, the transistor MN13 is ON because its gate is clamped to the second power supply voltage VDD2. The transistor MP13 is ON because its gate is clamped to the clamp voltage VDD3 at 1.8V. Accordingly, a current starts flowing from the node N1 to the ground voltage terminal GND through the transistors MP13, MN13 and MN11. Consequently, the voltage of the node N1 (intermediate voltage Vpgb) starts dropping from the first power supply voltage level (3.3V). Note that the transistor MP11 remains ON.

On the other hand, because the output voltage of the inverter circuit INV2 becomes lower than the threshold voltage Vtn of the transistor MN12, the transistor MN12 turns OFF. Accordingly, a current stops flowing from the node N2 to the ground voltage terminal GND through the transistors MP14, MN14 and MN12. Note that the transistor MP12 remains OFF.

Note that, as described above, the transistors MN18 and MN20 are both OFF. Thus, a bypass path is not formed between the node N1, N2 and the ground voltage terminal GND.

When the voltage of the node N1 (intermediate voltage Vpgb) drops to a voltage that is lower than the first power supply voltage level VDD1 (3.3V) by the threshold voltage Vtp of the transistor MP12 (Vpgb=VDD1−Vtp), the transistor MP12 where the voltage of the node N1 is applied to the gate changes from OFF to ON. The voltage of the node N2 (intermediate voltage Vpg) thereby rises to the first power supply voltage level (3.3V). Consequently, the transistor MP11 where the voltage of the node N2 is applied to the gate changes from ON to OFF. The voltage of the node N1 (intermediate voltage Vpgb) thereby drops further to a voltage that is higher than the clamp voltage VDD3 (1.8V) by the threshold voltage Vtp of the transistor MP13.

When the voltage of the node N2 (intermediate voltage Vpg) reaches the first power supply voltage level (3.3V), the transistor MP15 turns OFF because a gate-source voltage Vgs becomes lower than the threshold voltage Vtp of itself. Accordingly, a current does not flow from the first power supply voltage terminal VDD1 to the output terminal OUT through the transistors MP15 and MP16. On the other hand, the transistor MN15 turns ON because a signal at H level (output of the inverter circuit INV1) is applied to its gate. Further, the transistor MN16 is ON because its gate is clamped to the second power supply voltage VDD2. Accordingly, a current flows from the output terminal OUT to the ground voltage terminal GND through the transistors MN16 and MN15. Therefore, the voltage of the output terminal OUT drops to the ground voltage level (0V). Thus, the output circuit 12 outputs the output signal OUT at L level (0V) (time t24).

Note that, because the transistors MN18 and MN20 are OFF, the voltages of the nodes Vm2 and Vm1 do not drop to the ground voltage level. Further, because the gates of the transistors MN17 and MN19 are clamped to the second power supply voltage VDD2, the voltages of the nodes Vm2 and Vm1 do not rise to be higher than a voltage that is lower than the second power supply voltage VDD2 by the threshold voltage Vtn of the transistors MN17 and MN19. Thus, 0V<voltage of node Vm2,Vm1≤(second power supply voltage VDD2−threshold voltage Vtn) is satisfied.

Consequently, a voltage higher than a withstand voltage (for example, (3.3V)) is not applied between the source and the drain, the gate and the source, and the gate and the drain of each of the transistors MN17 to MN20 that constitute the bypass circuit 13. Therefore, the breakdown and degradation of each of the transistors MN17 to MN20 with a relatively low withstand voltage do not occur.

Note that a voltage higher than a withstand voltage (for example, (3.3V)) is not applied also between the source and the drain, the gate and the source, and the gate and the drain of each of the transistors MP11 to MP14 and MN11 to MN14 that constitute the level shift circuit 11. Likewise, a voltage higher than a withstand voltage (for example, (3.3V)) is not applied also between the source and the drain, the gate and the source, and the gate and the drain of each of the transistors MP15, MP16, MN15 and MN16 that constitute the output circuit 12. Therefore, the breakdown and degradation of each of the transistors MP11 to MP16 and MN11 to MN16 with a relatively low withstand voltage do not occur.

As described above, in the semiconductor integrated circuit 1 according to this embodiment, a voltage higher than a withstand voltage is not applied to the transistors MP11 to MP16 and MN11 to MN20 with a relatively low withstand voltage. It is thereby possible to prevent the breakdown and degradation of each of the transistors MP11 to MP16 and MN11 to MN20. In other words, the semiconductor integrated circuit 1 according to this embodiment does not need to be configured using transistors in a large size with a high withstand voltage, thereby preventing an increase in circuit size.

In sum, the semiconductor integrated circuit 1 according to this embodiment can generate the output signal OUT at a desired voltage level quickly under the low voltage condition without increasing the circuit size.

Further, as described above, only two transistors (MN17 and MN18 or MN19 and MN20) are placed in series on the bypass path that is formed under the low voltage condition. Therefore, the combined impedance of the current path through the transistors MP14, MN14 and MN12 and the bypass path (current path) through the transistors MN19 and MN20 between the node N2 and the ground voltage terminal GND is relatively small. In other words, the output impedance on the L level side at the node N2 under the low voltage condition is smaller than that under the high voltage condition. Likewise, the combined impedance of the current path through the transistors MP13, MN13 and MN11 and the bypass path (current path) through the transistors MN17 and MN18 between the node N1 and the ground voltage terminal GND is relatively small. In other words, the output impedance on the L level side at the node N1 under the low voltage condition is smaller than that under the high voltage condition.

Note that, when the voltage of the node N2 (intermediate voltage Vpg) drops under the low voltage condition, the on-resistance of the transistor MP12 just before the drop becomes lower than that under the low voltage condition in some cases. This is, for example, the case where VDD1=3.3V and VDD3=1.8V under the high voltage condition, and VDD1=1.8V and VDD3=0V under the low voltage condition. Note that the threshold voltage Vtp of the transistors MP13 and MP14 is assumed to be 0.4V.

In this case, the gate-source voltage of the transistor MP12 under the high voltage condition is VDD1−(VDD3+threshold voltage Vtp of the transistor MP13)=1.1V. On the other hand, the gate-source voltage of the transistor MP12 under the low voltage condition is VDD1−GND=1.8V. Thus, the gate-source voltage of the transistor MP12 under the low voltage condition is higher than that under the high voltage condition. Therefore, the on-resistance of the transistor MP12 under the low voltage condition is lower than that under the low voltage condition.

The low on-resistance of the transistor MP12 means that the voltage drop by the transistor MP12 is small when a current path is formed between the node N2 and the ground voltage terminal GND and a current starts flowing. This means that the output impedance on the H level side at the node N2 is large. In this case, if the output impedance on the L level side at the node N2 is the same between the high voltage condition and the low voltage condition, the drop of the voltage at the node N2 under the low voltage condition is slower than that under the high voltage condition.

However, in the semiconductor integrated circuit 1 according to this embodiment, the output impedance on the L level side at the node N2 varies between the high voltage condition and the low voltage condition as described above. Specifically, the output impedance on the L level side at the node N2 under the low voltage condition is smaller than that under the high voltage condition. Therefore, the ratio of the output impedance on the H level side and the output impedance on the L level side at the node N2 can be the same between the high voltage condition and the low voltage condition. It is thereby possible to prevent a decrease in the duty ratio.

(Difference Between Semiconductor Integrated Circuit 1 According to Embodiment and Related Art)

A difference between the semiconductor integrated circuit 1 according to this embodiment and the related art is described hereinafter.

Figure 7:
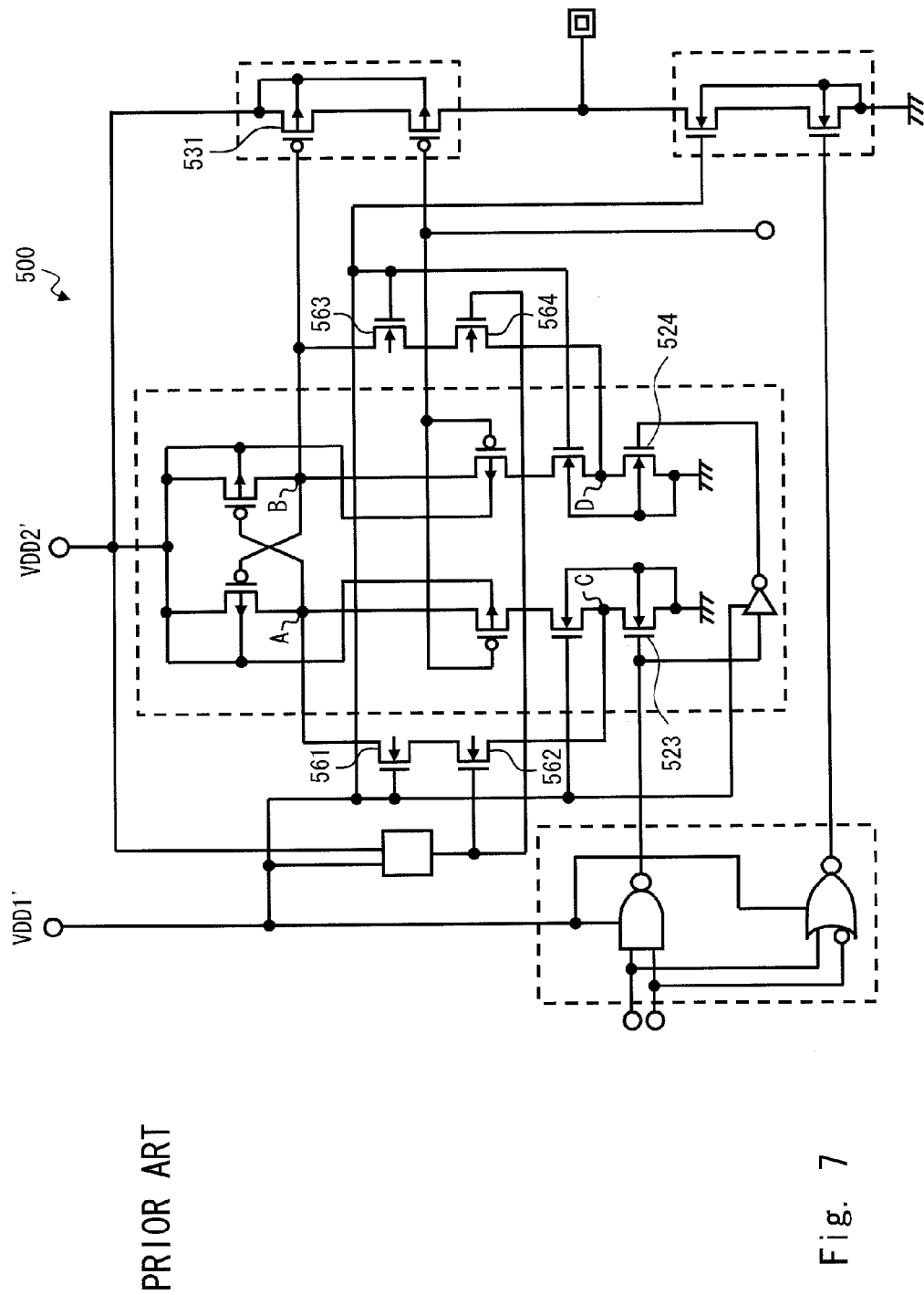
FIG. 7 is a diagram showing a configuration of a semiconductor integrated circuit according to related art.

FIG. 7 is a diagram showing a configuration of a semiconductor integrated circuit (output circuit) 500 that is disclosed in Japanese Patent No. 3530315. In the semiconductor integrated circuit 500 shown in FIG. 7, when a second voltage VDD2' is higher than a first voltage VDD1' (which is under the high voltage condition), N-type MOS transistors 562 and 564 are OFF, and a bypass is not formed between the nodes A and C and between the nodes B and D. On the other hand, when the second voltage VDD2' is equal to or lower than the first voltage VDD1' (which is under the low voltage condition), the N-type MOS transistors 562 and 564 are ON, and a bypass composed of N-type MOS transistors 561 and 562 is formed between the nodes A and C, and a bypass composed of N-type MOS transistors 563 and 564 is formed between the nodes B and D.

Therefore, in the case of outputting "H" from an output pad OUT, for example, the voltage of a node B is made to drop by the bypass composed of the N-type MOS transistors 563 and 564, and the voltage of the node B drops faster than the case where the bypass is not formed. The delay time when outputting "H" from the output pad OUT is thereby shortened.

However, in the semiconductor integrated circuit 500 shown in FIG. 7, three MOS transistors 563, 564 and 524 are placed in series on the bypass path between the node B and the ground, and therefore the impedance of the bypass path increases. As a result, in the semiconductor integrated circuit 500 shown in FIG. 7, the voltage of the node B cannot drop quickly, and the delay time when outputting "H" from the output pad OUT cannot be sufficiently shortened.

Likewise, in the semiconductor integrated circuit 500 shown in FIG. 7, three MOS transistors 561, 562 and 523 are placed in series on the bypass path between the node A and the ground, and therefore the impedance of the bypass path increases. As a result, in the semiconductor integrated circuit 500 shown in FIG. 7, the voltage of the node A cannot drop quickly (i.e. the voltage of the node B cannot rise quickly), and the delay time when outputting "L" from the output pad OUT cannot be sufficiently shortened.

In sum, in the semiconductor integrated circuit 500 shown in FIG. 7, because the impedance of the bypass path is large, the gate voltage of the output transistor 531 cannot change quickly, and therefore an output voltage at a desired level cannot be generated quickly. Note that, if the impedance of the bypass path is reduced by increasing the gate width of the three MOS transistors connected in series, the circuit size increases.

On the other hand, in the semiconductor integrated circuit 1 according to this embodiment, only two transistors MN19 and MN20 are placed in series on the bypass path between the node N2 and the ground voltage terminal GND, and therefore the impedance of the bypass path is relatively small. Thus, the semiconductor integrated circuit 1 according to this embodiment allows the voltage of the node N2 to drop faster than the related art, thereby quickly generating the output signal OUT at H level.

Likewise, in the semiconductor integrated circuit 1 according to this embodiment, only two transistors MN17 and MN18 are placed in series on the bypass path between the node N1 and the ground voltage terminal GND, and therefore the impedance of the bypass path is relatively small. Thus, the semiconductor integrated circuit 1 according to this embodiment allows the voltage of the node N1 to drop faster than the related art (i.e. allows the voltage of the node N2 to rise faster than the related art), thereby quickly generating the output signal OUT at L level.

In sum, in the semiconductor integrated circuit 1 according to this embodiment, because the impedance of the bypass path is small, it is possible to change the gate voltage of the output transistor MP15 quickly and thereby quickly generate the output voltage at a desired voltage level (particularly, H level).

Second Embodiment

Figure 5:
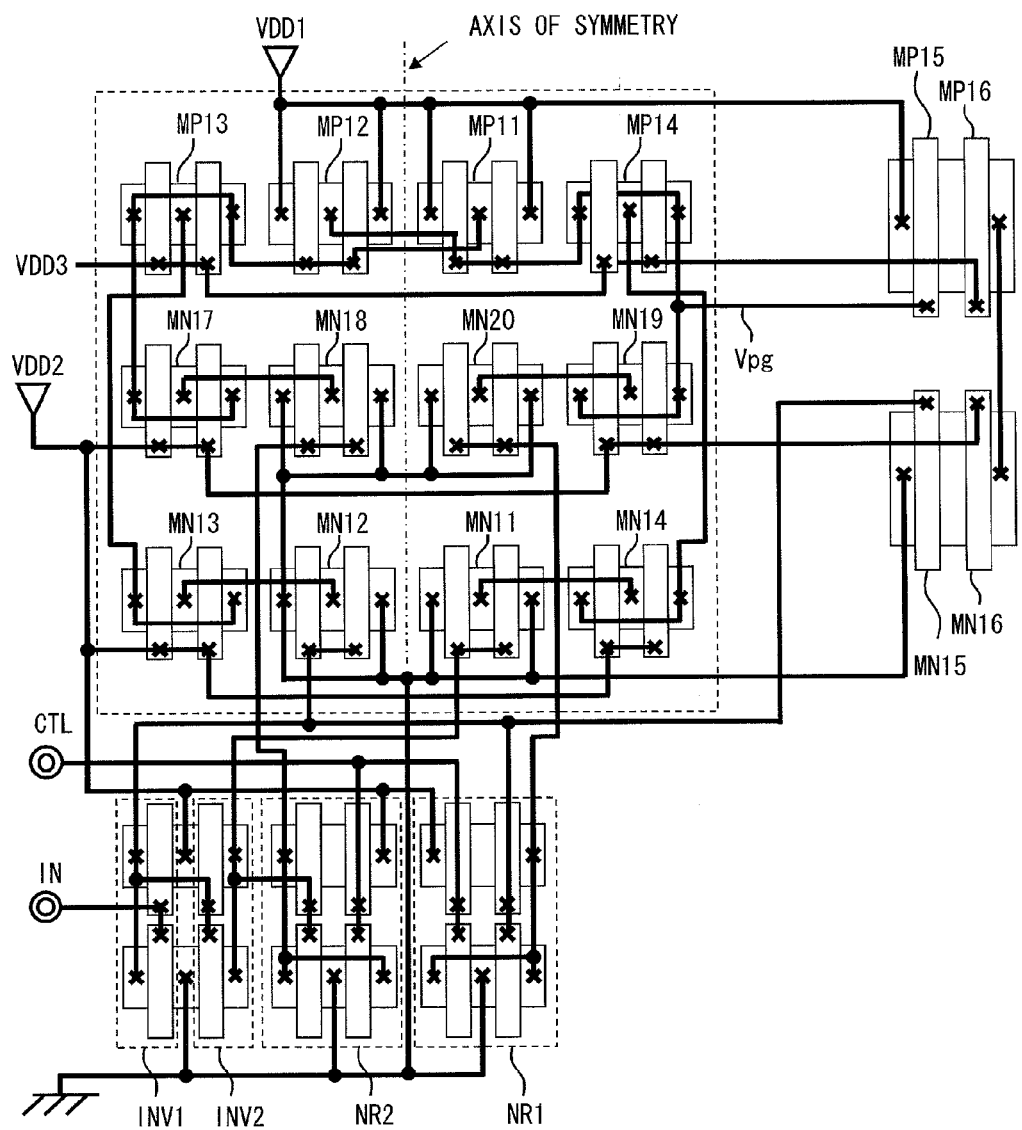
FIG. 5 is a diagram showing a layout configuration example of a semiconductor integrated circuit according to a second embodiment.

In this embodiment, the layout configuration of the semiconductor integrated circuit 1 shown in FIG. 1 is described. FIG. 5 is a diagram showing one example of the layout configuration of the semiconductor integrated circuit 1 shown in FIG. 1.

As shown in FIG. 5, the transistors MP13, MP12, MP11 and MP14 are arranged sequentially from left to right in the upper part of the paper. The transistors MN17, MN18, MN20 and MN19 are arranged sequentially from left to right therebelow. Further therebelow, the transistors MN13, MN12, MN11 and MN14 are arranged sequentially from left to right.

The level shift circuit 11 and the bypass circuit 13 are composed of those twelve transistors.

Further, the inverter circuit INV1, the inverter circuit INV2, the NOR circuit NR2 and the NOR circuit NR1 are arranged sequentially from left to right in the lower part of the paper. Further, the transistors MP15, MP16, MN15 and MN16 are arranged on the right of the paper.

Note that the twelve transistors that constitute the level shift circuit 11 and the bypass circuit 13 are arranged symmetrically about the alternate long and short dash line lying vertically on the paper as the axis of symmetry. The shift of the operation timing is thereby prevented.

Further, the transistors MP14, MN19 and MP15 that are connected to the node N2 are arranged in close proximity to one anther. The line capacity connecting the transistors MP14, MN19 and MP15 is thereby reduced, so that a higher speed operation can be achieved.

Figure 6:
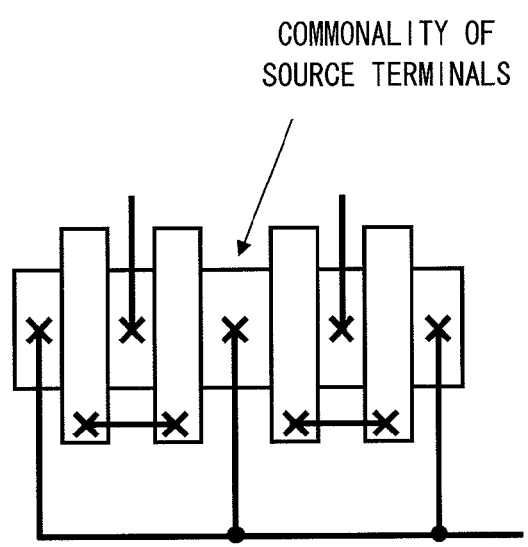
FIG. 6 is a diagram showing a layout configuration example of the semiconductor integrated circuit according to the second embodiment.

Further, the transistors MP11 and MP12 may have their source terminals in common (see FIG. 6). The transistors MN18 and MN20 may have their source terminals in common (see FIG. 6). The transistors MN12 and MN11 may have their source terminals in common (see FIG. 6). An increase in circuit size can be further prevented.

Although the layout configuration of the semiconductor integrated circuit 1 shown in FIG. 1 is described in this embodiment, it is also applicable to the layout configuration of a semiconductor integrated circuit according to another embodiment described hereinbelow, and the same advantageous effects can be expected.

Third Embodiment

Figure 8:
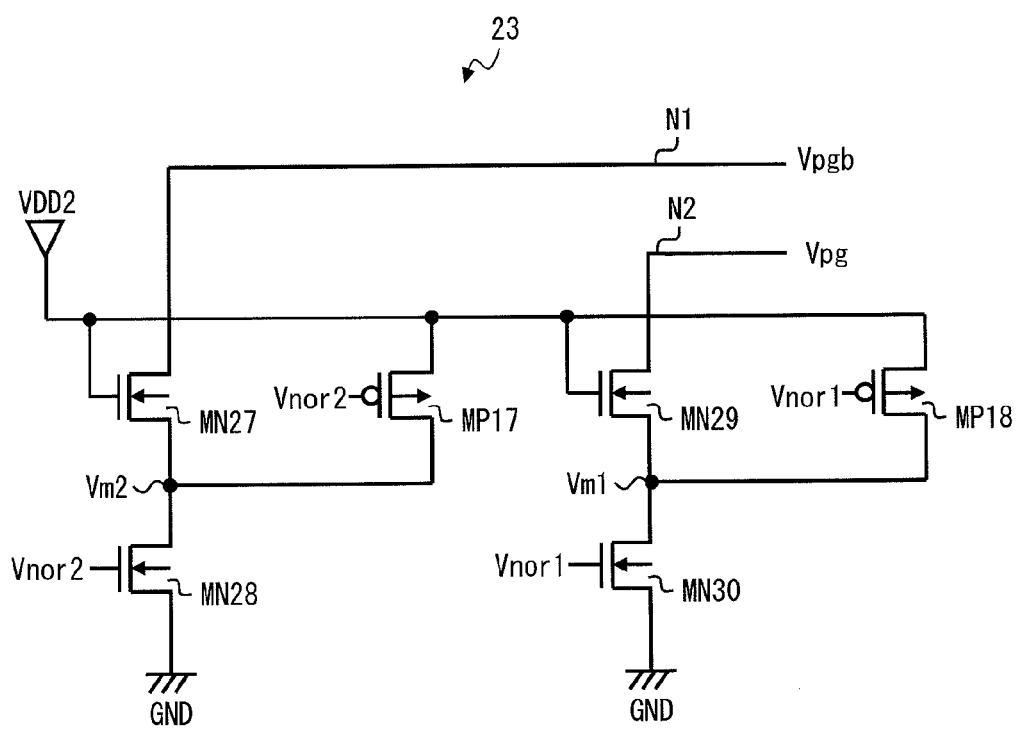
FIG. 8 is a diagram showing a configuration example of a bypass circuit included in a semiconductor integrated circuit according to a third embodiment.

A first alternative example of the bypass circuit 13 is described in this embodiment. FIG. 8 is a diagram showing the first alternative example of the bypass circuit 13 as a bypass circuit 23. The bypass circuit 23 is different from the bypass circuit 13 in that it further includes two P-channel MOS transistors. Specific description is given below.

The bypass circuit 23 shown in FIG. 8 includes a transistor (first bypass MOS transistor) MN27, a transistor (third bypass MOS transistor) MN28, a transistor (second bypass MOS transistor) MN29, a transistor (fourth bypass MOS transistor) MN30, a transistor (fifth bypass MOS transistor) MP17, and a transistor (sixth bypass MOS transistor) MP18. In this embodiment, the case where the transistors MN27 to MN30 are N-channel MOS transistors and the transistors MP17 and MP18 are P-channel MOS transistors is described as an example. Note that the transistors MN27, MN28, MN29 and MN30 correspond to the transistors MN17, MN18, MN19 and MN20, respectively.

In the bypass circuit 23, the source of the transistor MP17 is connected to the second power supply voltage terminal VDD2, the drain of the transistor MP17 is connected to the node Vm2, and the output signal Vnor2 of the NOR circuit NR2 is applied to the gate of the transistor MP17. The source of the transistor MP18 is connected to the second power supply voltage terminal VDD2, the drain of the transistor MP18 is connected to the node Vm1, and the output signal Vnor1 of the NOR circuit NR1 is applied to the gate of the transistor MP18. The connections of the transistors MN27 to MN30 are the same as those of the transistors MN17 to MN20 and not repeatedly described.

In the semiconductor integrated circuit 1 shown in FIG. 1, under the high voltage condition, the transistors MN18 and MN20 are both OFF because the output signals Vnor1 and Vnor2 at L level are output from the NOR circuits NR1 and NR2.

Further, in the semiconductor integrated circuit 1 shown in FIG. 1, when the input signal IN is H level, the transistor MP12 is OFF. Thus, the transistors MP12 and MN20 are both OFF when the input signal IN is H level under the high voltage condition. Therefore, when the input signal IN is H level under the high voltage condition, the voltage of the node N2 (intermediate voltage Vpg) is a value obtained by the resistance division of the off-resistance of the transistor MP12 and the off-resistance of the transistor MN20. As the off-resistance of the transistor MP12 is higher than the off-resistance of the transistor MN20, the intermediate voltage Vpg becomes lower. If the intermediate voltage Vpg gets too low, there is a possibility that the breakdown of the MOS transistors MP11 and MP15 with a low withstand voltage occurs.

Likewise, in the semiconductor integrated circuit 1 shown in FIG. 1, when the input signal IN is L level, the transistor MP11 is OFF. Thus, the transistors MP11 and MN18 are both OFF when the input signal IN is L level under the high voltage condition. Therefore, when the input signal IN is L level under the high voltage condition, the voltage of the node N1 (intermediate voltage Vpgb) is a value obtained by the resistance division of the off-resistance of the transistor MP11 and the off-resistance of the transistor MN18. As the off-resistance of the transistor MP11 is higher than the off-resistance of the transistor MN18, the intermediate voltage Vpgb becomes lower. If the intermediate voltage Vpgb gets too low, there is a possibility that the breakdown of the MOS transistors MP12 and MP15 with a low withstand voltage occurs.

On the other hand, in this embodiment, under the high voltage condition, the transistors MN28 and MN30 are both OFF and the transistors MP17 and MP18 are both ON. Accordingly, under the high voltage condition, the second power supply voltage VDD2 are supplied to the nodes Vm1 and Vm2 through the transistors MP18 and MP17, respectively. Thus, under the high voltage condition, the voltages of the nodes Vm1 and Vm2 are both the second power supply voltage VDD2 level.

Further, in this embodiment, when the input signal IN is H level, the transistor MP12 is OFF. Thus, when the input signal IN is H level under the high voltage condition, the transistors MP12 and MN30 are both OFF, and the transistor MP18 is ON. Accordingly, when the input signal IN is H level under the high voltage condition, the transistor MN29 is ON when the intermediate voltage Vpg becomes lower than the second power supply voltage VDD2 by the threshold voltage Vtn. Therefore, the intermediate voltage Vpg does not fall below VDD2−Vtn. Hence, by designing the circuit so as to satisfy VDD1−(VDD2−Vtn)<withstand voltage of MOS transistor, it is possible to prevent the breakdown and degradation of MOS transistors with a low withstand voltage.

Likewise, in this embodiment, when the input signal IN is L level, the transistor MP11 is OFF. Thus, when the input signal IN is L level under the high voltage condition, the transistors MP11 and MN28 are both OFF, and the transistor MP17 is ON. Accordingly, when the input signal IN is L level under the high voltage condition, the transistor MN27 is ON when the intermediate voltage Vpgb becomes lower than the second power supply voltage VDD2 by the threshold voltage Vtn. Therefore, the intermediate voltage Vpgb does not fall below VDD2−Vtn. Hence, by designing the circuit so as to satisfy VDD1−(VDD2−Vtn)<withstand voltage of MOS transistor, it is possible to prevent the breakdown and degradation of MOS transistors with a low withstand voltage.

The semiconductor integrated circuit to which the bypass circuit 23 according to this embodiment is applied has the same advantageous effects as the semiconductor integrated circuit according to the first embodiment. Specifically, in the semiconductor integrated circuit according to this embodiment, the time to drop the voltages of the nodes N1 and N2 can be shortened, and it is thereby possible to generate an output voltage at a desired voltage level quickly.

Further, in the semiconductor integrated circuit to which the bypass circuit 23 according to this embodiment is applied, the voltage drop of the nodes N1 and N2 in the floating state can be prevented, and it is thereby possible to prevent the breakdown and degradation of MOS transistors with a low withstand voltage.

Fourth Embodiment

Figure 9:
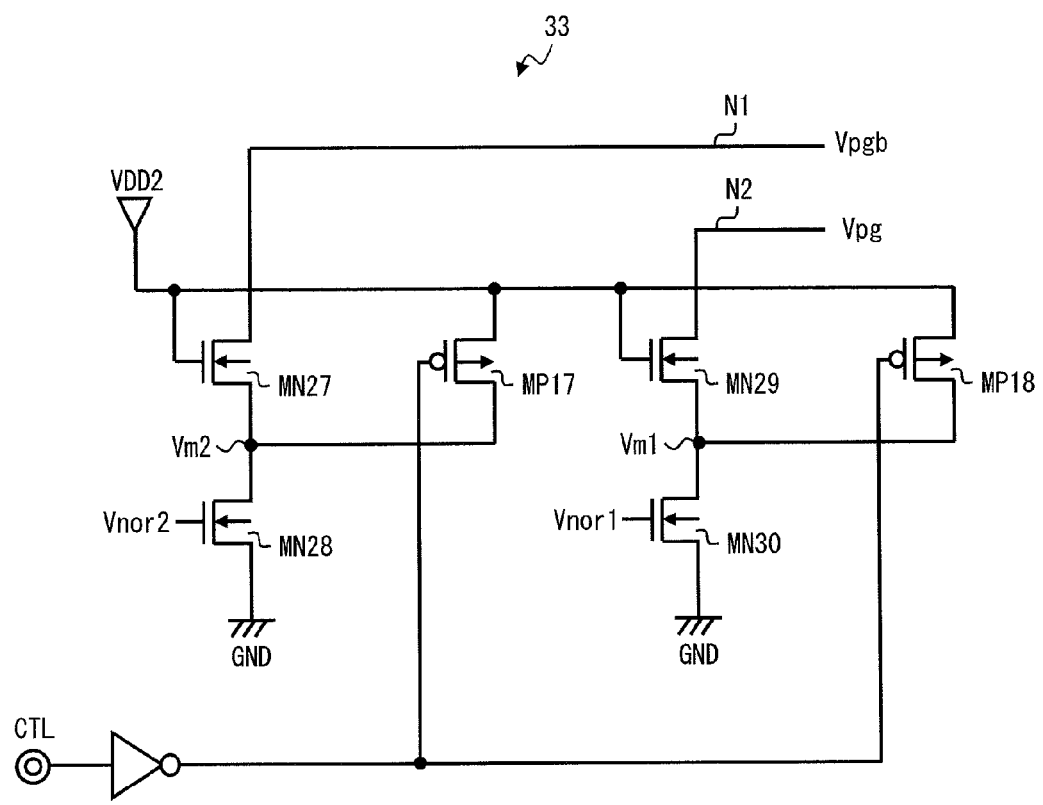
FIG. 9 is a diagram showing a configuration example of a bypass circuit included in a semiconductor integrated circuit according to a fourth embodiment.

A second alternative example of the bypass circuit 13 is described in this embodiment. FIG. 9 is a diagram showing the second alternative example of the bypass circuit 13 as a bypass circuit 33. The bypass circuit 33 is different from the bypass circuit 23 shown in FIG. 8 in signals to control ON and OFF of the transistors MP17 and MP18.

Specifically, the inverted signal of the voltage condition switch signal CTL is supplied to the gate of the transistor MP17, instead of the output signal Vnor2. The inverted signal of the voltage condition switch signal CTL is supplied to the gate of the transistor MP18, instead of the output signal Vnor1. The other configuration of the bypass circuit 33 is the same as that of the bypass circuit 23 and not repeatedly described.

In the bypass circuit 33 shown in FIG. 9, the transistors MP17 and MP18 are always OFF under the low voltage condition. It is thereby possible to prevent the transistors MP17 and MP18 from contributing to the rising of the voltages of the nodes N1 and N2.

The semiconductor integrated circuit to which the bypass circuit 33 according to this embodiment is applied has the same advantageous effects as the semiconductor integrated circuit according to the third embodiment. Specifically, in the semiconductor integrated circuit according to this embodiment, the time to drop the voltages of the nodes N1 and N2 can be shortened, and it is thereby possible to generate an output voltage at a desired voltage level quickly. Further, in the semiconductor integrated circuit to which the bypass circuit 33 according to this embodiment is applied, the voltage drop of the nodes N1 and N2 in the floating state can be prevented, and it is thereby possible to prevent the breakdown and degradation of MOS transistors with a low withstand voltage.

Furthermore, in the semiconductor integrated circuit to which the bypass circuit 33 according to this embodiment is applied, it is possible to prevent the transistors MP17 and MP18 from contributing to the rising of the voltages of the nodes N1 and N2.

Fifth Embodiment

Figure 10:
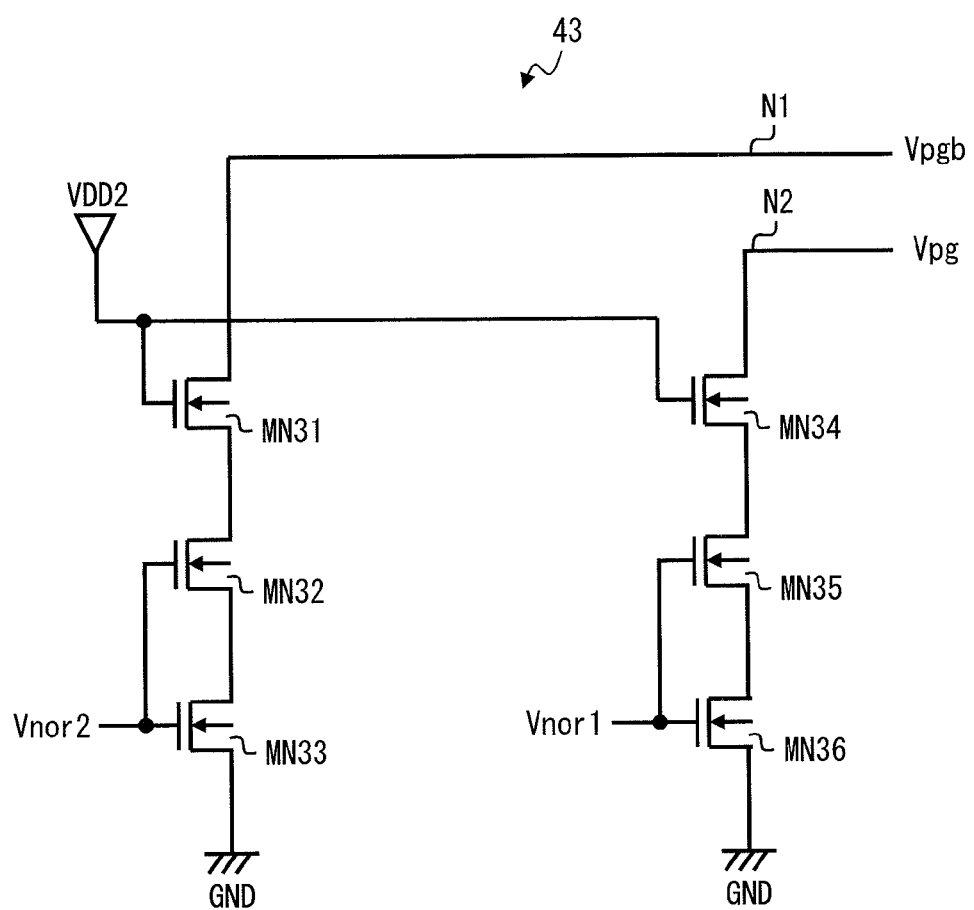
FIG. 10 is a diagram showing a configuration example of a bypass circuit included in a semiconductor integrated circuit according to a fifth embodiment.

A third alternative example of the bypass circuit 13 is described in this embodiment. FIG. 10 is a diagram showing the third alternative example of the bypass circuit 13 as a bypass circuit 43. In the bypass circuit 13, MOS transistors are stacked vertically in two stages on the bypass path. On the other hand, in the bypass circuit 43, MOS transistors are stacked vertically in three stages on the bypass path. Specific description is given below.

The bypass circuit 43 shown in FIG. 10 includes transistors MN31 to MN36, which are N-channel MOS transistors. Note that the transistors MN31, MN32, MN34 and MN35 correspond to the transistors MN17, MN18, MN19 and MN20, respectively.

The transistor (seventh bypass MOS transistor) MN33 is placed in series (stacked vertically) with the transistors MN31 and MN32, and the output signal Vnor2 is supplied to its gate. The transistor (eighth bypass MOS transistor) MN36 is placed in series (stacked vertically) with the transistors MN34 and MN35, and the output signal Vnor1 is supplied to its gate. The connections of the transistors MN31, MN32, MN34 and MN35 are the same as those of the transistors MN17, MN18, MN19 and MN20 and not repeatedly described.

The semiconductor integrated circuit to which the bypass circuit 43 according to this embodiment is applied has the same advantageous effects as the semiconductor integrated circuit according to the first embodiment. Specifically, in the semiconductor integrated circuit to which the bypass circuit 43 according to this embodiment is applied, the time to drop the voltages of the nodes N1 and N2 can be shortened, and it is thereby possible to generate an output voltage at a desired voltage level quickly.

Sixth Embodiment

Figure 11:
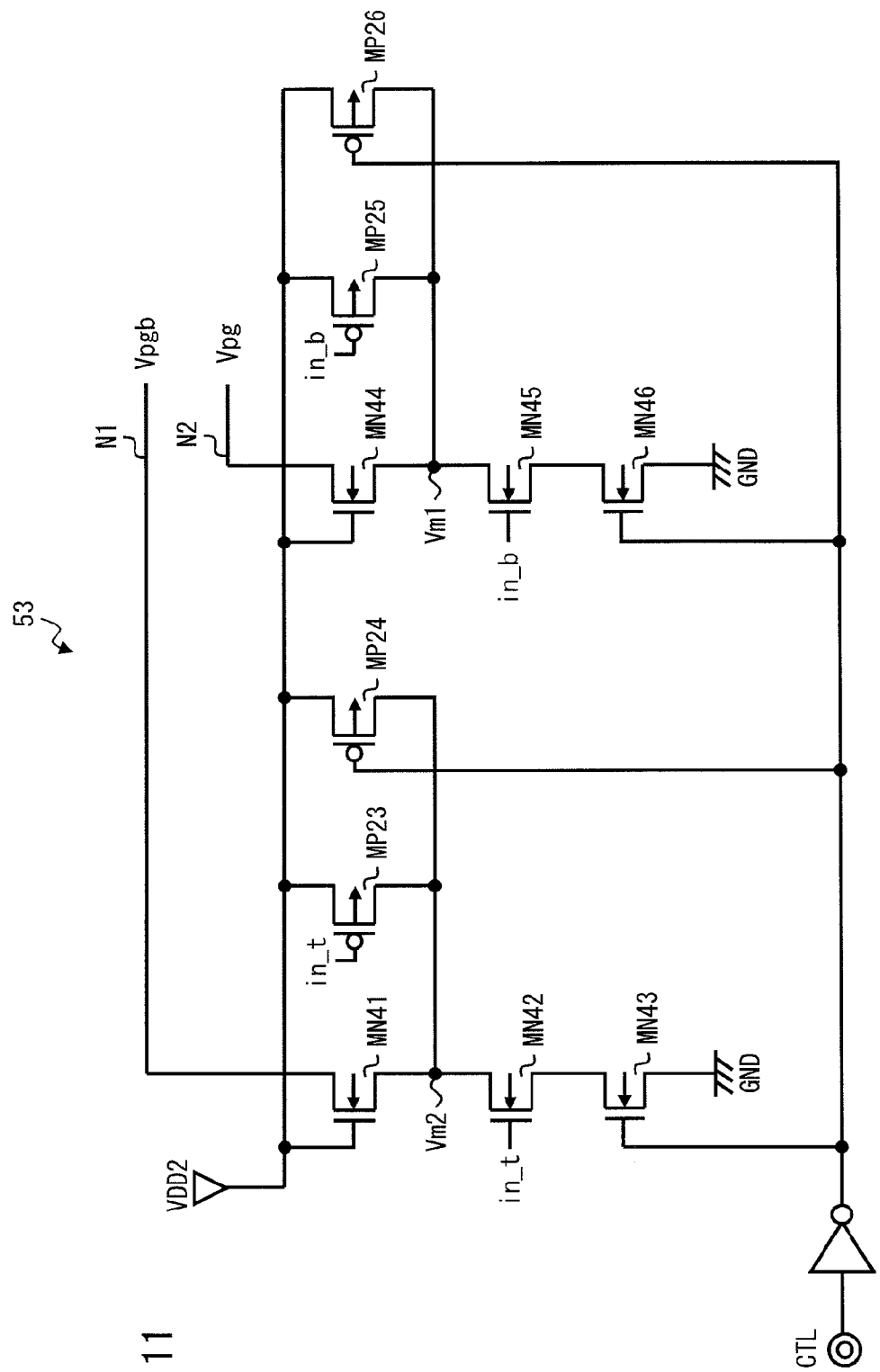
FIG. 11 is a diagram showing a configuration example of a bypass circuit included in a semiconductor integrated circuit according to a sixth embodiment.

A fourth alternative example of the bypass circuit 13 is described in this embodiment. FIG. 11 is a diagram showing the fourth alternative example of the bypass circuit 13 as a bypass circuit 53. The bypass circuit 53 incorporates the functions of the bypass circuit 13 and the NOR circuits NR1 and NR2. Specific description is given below.

The bypass circuit 53 shown in FIG. 11 includes transistors MN41 to MN46, which are N-channel MOS transistors, and transistors MP23 to MP26, which are P-channel MOS transistors.

In the bypass circuit 53, the source of the transistor MN41 is connected to the node Vm2, the drain of the transistor MN41 is connected to the node N1, and the second power supply voltage VDD2 is applied to the gate of the transistor MN41. The source of the transistor MN42 is connected to the drain of the transistor MN43, the drain of the transistor MN42 is connected to the node Vm2, and the output of the inverter circuit INV2 (which is the non-inverted signal of the input signal IN) in_t is applied to the gate of the transistor MN42. The source of the transistor MN43 is connected to the ground voltage terminal GND, and the inverted signal of the voltage condition switch signal CTL is applied to the gate of the transistor MN43.

The source of the transistor MP23 is connected to the second power supply voltage terminal VDD2, the drain of the transistor MP23 is connected to the node Vm2, and the output in_t of the inverter circuit INV2 is applied to the gate of the transistor MP23. The source of the transistor MP24 is connected to the second power supply voltage terminal VDD2, the drain of the transistor MP24 is connected to the node Vm2, and the inverted signal of the voltage condition switch signal CTL is applied to the gate of the transistor MP24.

The source of the transistor MN44 is connected to the node Vm1, the drain of the transistor MN44 is connected to the node N2, and the second power supply voltage VDD2 is applied to the gate of the transistor MN44. The source of the transistor MN45 is connected to the drain of the transistor MN46, the drain of the transistor MN45 is connected to the node Vm1, and the output of the inverter circuit INV1 (which is the inverted signal of the input signal IN) in_b is applied to the gate of the transistor MN45. The source of the transistor MN46 is connected to the ground voltage terminal GND, and the inverted signal of the voltage condition switch signal CTL is applied to the gate of the transistor MN46.

The source of the transistor MP25 is connected to the second power supply voltage terminal VDD2, the drain of the transistor MP25 is connected to the node Vm1, and the output in_b of the inverter circuit INV1 is applied to the gate of the transistor MP25. The source of the transistor MP26 is connected to the second power supply voltage terminal VDD2, the drain of the transistor MP26 is connected to the node Vm1, and the inverted signal of the voltage condition switch signal CTL is applied to the gate of the transistor MP26.

The semiconductor integrated circuit to which the bypass circuit 53 according to this embodiment is applied has the same advantageous effects as the semiconductor integrated circuit according to the first embodiment. Specifically, in the semiconductor integrated circuit to which the bypass circuit 53 according to this embodiment is applied, the time to drop the voltages of the nodes N1 and N2 can be shortened, and it is thereby possible to generate an output voltage at a desired voltage level quickly.

Further, in the semiconductor integrated circuit to which the bypass circuit 53 according to this embodiment is applied, the voltage drop of the nodes N1 and N2 in the floating state can be prevented as in the third embodiment, and it is thereby possible to prevent the breakdown and degradation of MOS transistors with a low withstand voltage.

Furthermore, in the semiconductor integrated circuit to which the bypass circuit 53 according to this embodiment is applied, the bypass circuit 53 incorporates the functions of the bypass circuit 13 and the NOR circuits NR1 and NR2 and it is thereby possible to prevent an increase in circuit size.

Seventh Embodiment

Figure 12:
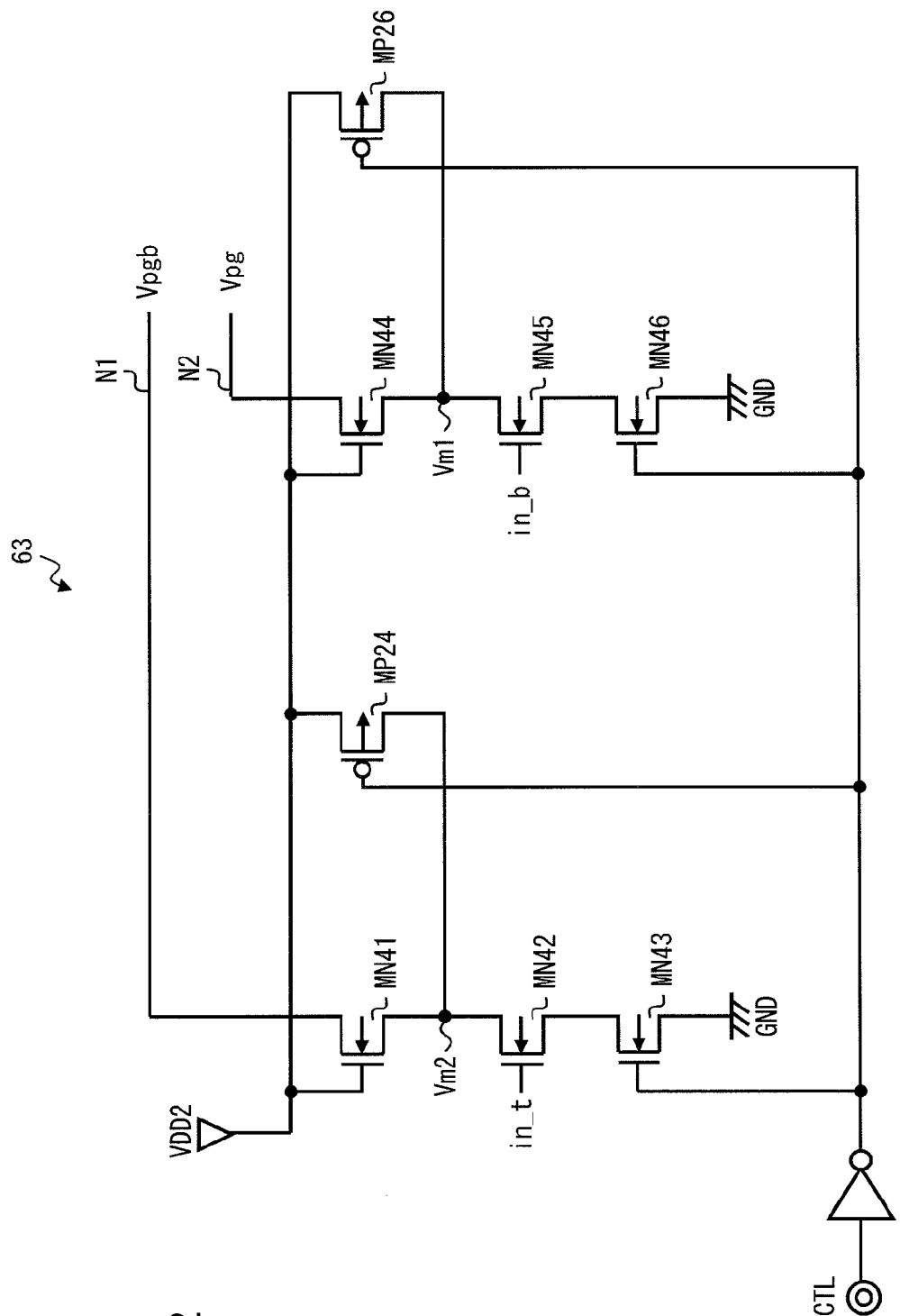
FIG. 12 is a diagram showing a configuration example of a bypass circuit included in a semiconductor integrated circuit according to a seventh embodiment.

A fifth alternative example of the bypass circuit 13 is described in this embodiment. FIG. 12 is a diagram showing the fifth alternative example of the bypass circuit 13 as a bypass circuit 63. The bypass circuit 63 is different from the bypass circuit 53 shown in FIG. 11 in that it does not include the transistors MP23 and MP25. The other configuration of the bypass circuit 63 is the same as that of the bypass circuit 53 and not repeatedly described.

In the bypass circuit 63 shown in FIG. 12, it is possible to prevent the transistors MP23 and MP25 from contributing to the rising of the voltages of the nodes N1 and N2 under the low voltage condition.

The semiconductor integrated circuit to which the bypass circuit 63 according to this embodiment is applied has the same advantageous effects as the semiconductor integrated circuit according to the sixth embodiment.

Further, in the semiconductor integrated circuit to which the bypass circuit 63 according to this embodiment is applied, it is possible to prevent the transistors MP23 and MP25 from contributing to the rising of the voltages of the nodes N1 and N2 under the low voltage condition.

Figure 13:
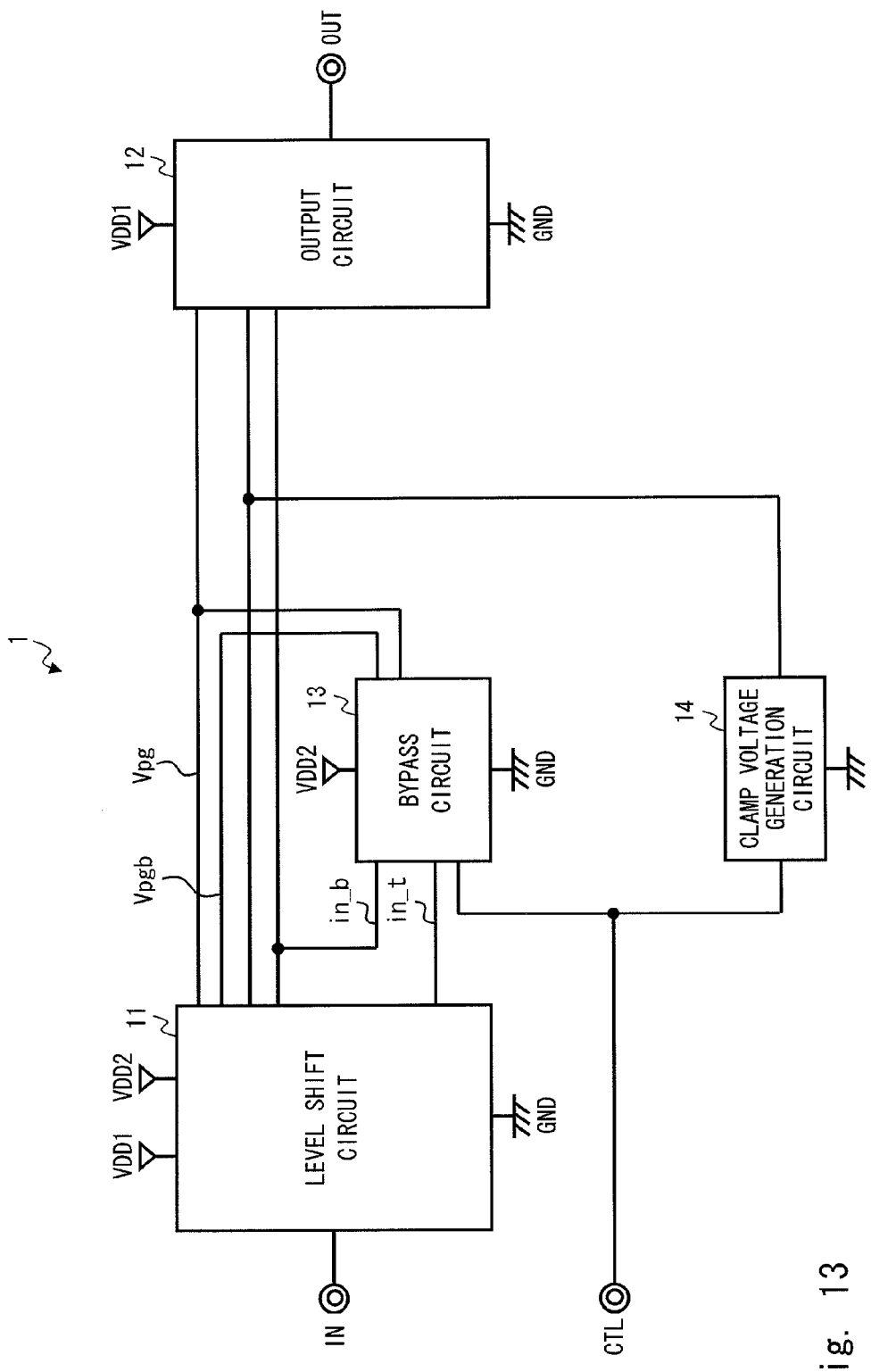
FIG. 13 is a block diagram showing a configuration example of a semiconductor integrated circuit according to the first to seventh embodiments.

FIG. 13 is a block diagram showing the configuration example of the semiconductor integrated circuit according to the first to seventh embodiment in an abstract fashion.

Eighth Embodiment

Figure 14:
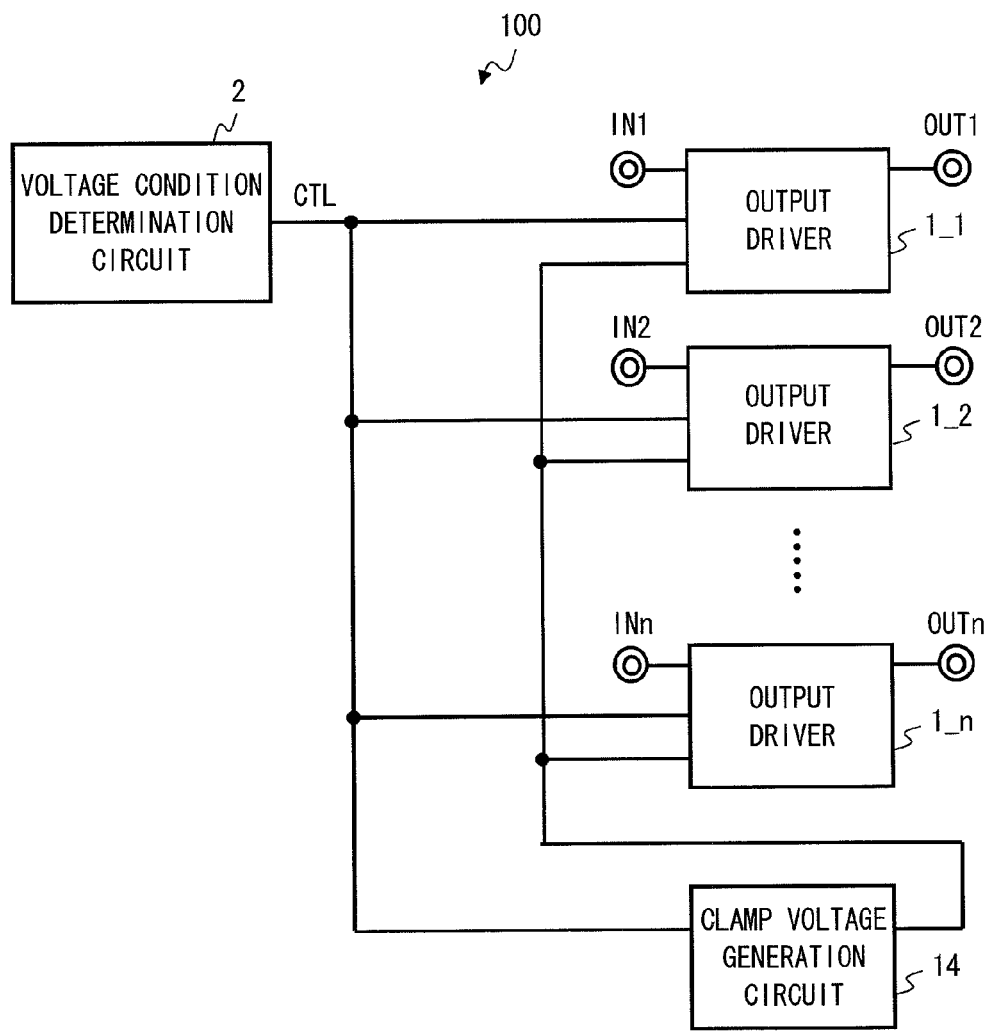
FIG. 14 is a block diagram showing a configuration example of an LSI system according to an eighth embodiment.

FIG. 14 is a block diagram showing a configuration example of an LSI system to which a plurality of semiconductor integrated circuits according to the above-described embodiments are applied. Although the case where a plurality of semiconductor integrated circuit 1 shown in FIG. 1 are applied to the LSI system is described as an example in this embodiment, the semiconductor integrated circuits according to another embodiment may be applied instead.

An LSI system 100 shown in FIG. 14 includes n (n is a natural number) number of output drivers 1_1 to 1_n that generate an output voltage, a voltage condition determination circuit 2 that generates the voltage condition switch signal CTL, and the clamp voltage generation circuit 14.

Note that the configuration of the semiconductor integrated circuit 1 is used in each of the output drivers 1_1 to 1_n. However, in the example of FIG. 14, the output drivers 1_1 to 1_n share one clamp voltage generation circuit 14.

As described above, the semiconductor integrated circuit according to the above-described embodiments forms a bypass path for quickly changing the gate voltage of the output transistor under the low voltage condition, thereby generating the output signal OUT at a desired voltage level quickly.

Further, the semiconductor integrated circuit according to the above-described embodiments does not apply a voltage higher than a withstand voltage to the transistors MP11 to MP16 and MN11 to MN20 with a relatively low withstand voltage. It is thereby possible to prevent the breakdown and degradation of each of the transistors MP11 to MP16 and MN11 to MN20. In other words, the semiconductor integrated circuit according to the above-described embodiments does not need to be configured using transistors in a large size with a high withstand voltage, thereby preventing an increase in circuit size.

Although embodiments of the present invention are described in the foregoing, the present invention is not restricted to the above-described embodiments, and various changes and modifications may be made without departing from the scope of the invention.

Although the case where the clamp voltage generation circuit 14 generates the clamp voltage VDD3 at the second power supply voltage level (1.8V) under the high voltage condition is described as an example in the above-described embodiments, the present invention is not limited thereto. The clamp voltage generation circuit 14 may be modified as appropriate to the configuration that generates the clamp voltage VDD3 at any level that is higher than the ground voltage and lower than the first power supply voltage.

The first to eighth embodiments can be combined as desirable by one of ordinary skill in the art.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:

1. A semiconductor integrated circuit comprising:
a level shift circuit including
first and second PMOS transistors placed in parallel between a first power supply terminal through which a first power supply voltage at a level in accordance with a voltage condition is supplied and a ground voltage terminal, each transistor having a gate connected to a drain of the other transistor,
third and fourth PMOS transistors respectively placed between drains of the first and second PMOS transistors and the ground voltage terminal, each transistor having a gate to which a clamp voltage at a level in accordance with the voltage condition is applied, first and second NMOS transistors respectively placed between drains of the third and fourth PMOS transistors and the ground voltage terminal, each transistor having a gate to which a second power supply voltage at a specified level is applied, and third and fourth NMOS transistors respectively placed between sources of the first and second NMOS transistors and the ground voltage terminal, each transistor controlled to be ON and OFF in a complementary manner in accordance with an input signal;

a bypass circuit including first and second bypass MOS transistors respectively placed between drains of the first and second PMOS transistors and the ground voltage terminal, each transistor having a gate to which the second power supply voltage is applied, and third and fourth bypass MOS transistors respectively placed between the first and second bypass MOS transistors and the ground voltage terminal, each transistor controlled to be ON and OFF in accordance with the input signal and the voltage condition; and an output circuit including a fifth PMOS transistor placed between the first power supply terminal and an external output terminal, the transistor having a gate to which a drain voltage of the second PMOS transistor is applied, a sixth PMOS transistor placed between a drain of the fifth PMOS transistor and the external output terminal, the transistor having a gate to which the clamp voltage is applied, a fifth NMOS transistor placed between the ground voltage terminal and the external output terminal, the transistor controlled to be ON and OFF in accordance with the input signal, and a sixth NMOS transistor placed between a drain of the fifth NMOS transistor and the external output terminal, the transistor having a gate to which the second power supply voltage is applied.

2. The semiconductor integrated circuit according to claim 1, wherein, under a low voltage condition where the first power supply voltage is a low voltage level, the third bypass MOS transistor is ON when the third NMOS transistor is ON, the fourth bypass MOS transistor is ON when the fourth NMOS transistor is ON, the third bypass MOS transistor is OFF when the third NMOS transistor is OFF, and the fourth bypass MOS transistor is OFF when the fourth NMOS transistor is OFF.

3. The semiconductor integrated circuit according to claim 1, wherein, under a high voltage condition where the first power supply voltage is a high voltage level, the third and fourth bypass MOS transistors are both OFF.

4. The semiconductor integrated circuit according to claim 1, further comprising:

a clamp voltage generation circuit that generates the clamp voltage at a ground voltage level under a low voltage condition where the first power supply voltage is a low voltage level and generates the clamp voltage at a level higher than the ground voltage and lower than the first power supply voltage under a high voltage condition where the first power supply voltage is a high voltage level.

5. The semiconductor integrated circuit according to claim 1, further comprising:

a clamp voltage generation circuit that generates the clamp voltage at a ground voltage level under a low voltage condition where the first power supply voltage is a low voltage level and generates the clamp voltage at substantially the same level as the second power supply voltage under a high voltage condition where the first power supply voltage is a high voltage level.

6. The semiconductor integrated circuit according to claim 1, wherein the first power supply voltage at substantially the same level as the second power supply voltage is supplied to the first power supply terminal under a low voltage condition, and the first power supply voltage at a higher level than the second power supply voltage is supplied to the first power supply terminal under a high voltage condition.

7. The semiconductor integrated circuit according to claim 1, wherein the fourth PMOS transistor, the fifth PMOS transistor and the second bypass MOS transistor are placed in proximity to one another.

8. The semiconductor integrated circuit according to claim 1, wherein the second PMOS transistor, the third bypass MOS transistor, the fourth NMOS transistor, the first NMOS transistor, the first bypass MOS transistor and the third PMOS transistor are arranged symmetrically to the first PMOS transistor, the fourth bypass MOS transistor, the third NMOS transistor, the second NMOS transistor, the second bypass MOS transistor and the fourth PMOS transistor, respectively.

9. The semiconductor integrated circuit according to claim 1, wherein the bypass circuit further includes a fifth bypass MOS transistor placed between a second power supply terminal through which the second power supply voltage is supplied and a node between the first and third bypass MOS transistors, the transistor controlled to be ON and OFF in a complementary manner to the third bypass MOS transistor, and a sixth bypass MOS transistor placed between the second power supply terminal and a node between the second and fourth bypass MOS transistors, the transistor controlled to be ON and OFF in a complementary manner to the fourth bypass MOS transistor.

10. The semiconductor integrated circuit according to claim 1, wherein the bypass circuit further includes a fifth bypass MOS transistor placed between a second power supply terminal through which the second power supply voltage is supplied and a node between the first and third bypass MOS transistors, the transistor being OFF under a low voltage condition and ON under a high voltage condition, and a sixth bypass MOS transistor placed between the second power supply terminal and a node between the second and fourth bypass MOS transistors, the transistor being OFF under a low voltage condition and ON under a high voltage condition.

11. The semiconductor integrated circuit according to claim 1, wherein the bypass circuit further includes a seventh bypass MOS transistor placed between the third bypass MOS transistor and the ground voltage terminal, the transistor controlled to be ON and OFF in accordance with the input signal and the voltage condition, and an eighth bypass MOS transistor placed between the fourth bypass MOS transistor and the ground voltage terminal, the transistor controlled to be ON and OFF in accordance with the input signal and the voltage condition.

12. An LSI system comprising:

a plurality of semiconductor integrated circuits according to claim 1 that generate an output voltage from the external output terminal; and a clamp voltage generation circuit that generates the clamp voltage at a ground voltage level under a low voltage condition where the first power supply voltage is a low voltage level and generates the clamp voltage at a level higher than the ground voltage and lower than the first power supply voltage under a high voltage condition where the first power supply voltage is a high voltage level.

* * * * *